United States Patent
Janik et al.

(10) Patent No.: US 8,022,641 B2
(45) Date of Patent: Sep. 20, 2011

(54) RECESSED LED DOWN LIGHT

(75) Inventors: Raymond Janik, Wheaton, IL (US);
Stephen H. Yuen, Darien, IL (US);
Michael T. Thornton, Burr Ridge, IL
(US); David E. Doubek, LaGrange, IL
(US); Peter F. Thornton, Jr., Westmont,
IL (US)

(73) Assignee: Focal Point, L.L.C., Chicago, IL (US)

( * ) Notice: Subject to any disclaimer, the term of this patent is extended or adjusted under 35 U.S.C. 154(b) by 385 days.

(21) Appl. No.: 12/434,452

(22) Filed: May 1, 2009

(65) Prior Publication Data

US 2010/0277905 A1    Nov. 4, 2010

(51) Int. Cl.
H05B 37/02    (2006.01)
H01J 9/00     (2006.01)

(52) U.S. Cl. ............... 315/297; 315/185 R; 315/209 R; 362/249.02; 445/23

(58) Field of Classification Search .......... 315/250, 315/209 R, 185 R, 291, 294, 297, 312, 313; 362/249.02, 249.06; 445/23
See application file for complete search history.

(56) References Cited

U.S. PATENT DOCUMENTS

| | | | |
|---|---|---|---|
| 5,333,228 A | 7/1994 | Kingstone | |
| 5,376,201 A | 12/1994 | Kingstone | |
| 5,528,714 A | 6/1996 | Kingstone | |
| 5,617,496 A | 4/1997 | Kingstone | |
| 5,617,497 A | 4/1997 | Kingstone | |
| 5,789,471 A | 8/1998 | Caruso | |
| 5,838,860 A | 11/1998 | Kingstone et al. | |
| 6,191,541 B1 * | 2/2001 | Patel et al. | 315/307 |
| 6,200,012 B1 | 3/2001 | Ouyang | |
| 6,337,945 B1 | 1/2002 | Kingstone | |
| 6,367,100 B2 | 4/2002 | Koren et al. | |
| 6,375,342 B1 | 4/2002 | Koren et al. | |
| 6,393,192 B1 | 5/2002 | Koren | |
| 6,398,397 B1 | 6/2002 | Koren | |
| 6,422,730 B1 | 7/2002 | Koren et al. | |

(Continued)

FOREIGN PATENT DOCUMENTS

DE            69428044         1/2002

(Continued)

OTHER PUBLICATIONS

Array LED G4, Technical Specifications, Array Lighting, Nexxus Lighting, Inc., 2008:1.

(Continued)

Primary Examiner — Don Le
(74) Attorney, Agent, or Firm — Banner & Witcoff, Ltd.

(57) ABSTRACT

In an embodiment of the present invention, a light emitting diode (LED) recessed down light fixture comprises a housing, a reflector assembly mounted to the housing, and an LED circuit board attached to the housing over the reflector assembly. The LED circuit board includes a plurality of resistors electrically connected to the LED circuit board, a bridge rectifier, and a plurality of at least 80 miniature LEDs electrically connected to the LED circuit board and configured to provide light. The plurality of miniature LEDs are separated into a plurality of LED clusters. Each cluster is electrically connected to at least one resistor. Further, the plurality of miniature LEDs are arranged in a configuration such that a voltage differential across any two proximate LEDs is less than 36 volts. The down light fixture further comprises a lens cover attached to the top end of the reflector assembly.

49 Claims, 15 Drawing Sheets

U.S. PATENT DOCUMENTS

| | | | |
|---|---|---|---|
| 6,478,450 | B1 | 11/2002 | Grajcar |
| 6,484,952 | B2 | 11/2002 | Koren |
| 6,561,700 | B1 | 5/2003 | Koren |
| 6,827,464 | B2 | 12/2004 | Koren et al. |
| 6,971,760 | B2 | 12/2005 | Archer et al. |
| 7,062,129 | B2 | 6/2006 | Archer |
| 7,204,602 | B2 | 4/2007 | Archer |
| 7,229,027 | B2 | 6/2007 | Ehresman et al. |
| 7,244,037 | B2 | 7/2007 | Koren et al. |
| 7,303,301 | B2 | 12/2007 | Koren et al. |
| 7,327,930 | B2 | 2/2008 | Koren et al. |
| 7,410,268 | B2 | 8/2008 | Koren et al. |
| 7,489,086 | B2 | 2/2009 | Miskin et al. |
| 7,759,876 | B2 * | 7/2010 | Rivas et al. .................. 315/247 |
| 7,788,833 | B2 * | 9/2010 | Hauck et al. .................. 40/442 |
| 7,901,107 | B2 * | 3/2011 | Van De Ven et al. ......... 362/231 |
| 2002/0149933 | A1 | 10/2002 | Archer et al. |
| 2002/0159257 | A1 | 10/2002 | Grajcar |
| 2003/0048632 | A1 | 3/2003 | Archer |
| 2004/0101244 | A1 | 5/2004 | Archer |
| 2006/0087838 | A1 | 4/2006 | Grajcar |
| 2006/0160409 | A1 * | 7/2006 | Shimizu et al. ............... 439/490 |
| 2006/0215402 | A1 | 9/2006 | Koren et al. |
| 2006/0220571 | A1 | 10/2006 | Howell et al. |
| 2007/0096134 | A1 | 5/2007 | Kim et al. |
| 2007/0262725 | A1 | 11/2007 | Koren |
| 2007/0262933 | A1 | 11/2007 | Streitz |
| 2007/0263378 | A1 | 11/2007 | Koren |
| 2007/0279900 | A1 | 12/2007 | Bauer et al. |
| 2007/0290629 | A1 | 12/2007 | Koren |
| 2008/0012501 | A1 | 1/2008 | Grajcar |
| 2008/0080168 | A1 | 4/2008 | Harris et al. |
| 2008/0297068 | A1 | 12/2008 | Koren et al. |
| 2009/0013570 | A1 | 1/2009 | Grajcar |
| 2009/0067191 | A1 | 3/2009 | Faber et al. |
| 2010/0109562 | A1 * | 5/2010 | Shen et al. .................... 315/294 |

FOREIGN PATENT DOCUMENTS

| | | |
|---|---|---|
| EP | 0389542 | 10/1990 |
| EP | 0700530 | 8/2001 |
| EP | 1381810 | 1/2004 |
| WO | 8905086 | 6/1989 |
| WO | 9428451 | 12/1994 |
| WO | 9501298 | 1/1995 |
| WO | 0069294 | 11/2000 |
| WO | 0070370 | 11/2000 |
| WO | 0070371 | 11/2000 |
| WO | 0070372 | 11/2000 |
| WO | 0070641 | 11/2000 |
| WO | 02077519 | 10/2002 |
| WO | 2004049028 | 6/2004 |
| WO | 2007053645 | 5/2007 |
| WO | 2007139975 | 12/2007 |

OTHER PUBLICATIONS

Array LED lamps with Selective Heat Sink Technology, Array Brochure, Array Lighting, Nexxus Lighting, Inc., 2009:1-2.

Array LED PAR30 6.0 Watt, Technical Specifications, Array Lighting, Nexxus Lighting, Inc., 2008:1.

LED Square DL/4-950, recessed LED downlight, Edison Price Lighting, Apr. 2009:1-2.

LED Square WL/5-950, recessed lensed LED wallwasher, Edison Price Lighting, Apr. 2009:1-2.

LED Square DL/5-950, recessed LED downlight, Edison Price Lighting, Apr. 2009:1-2.

Halo LED Recessed Lighting in the 21st Century, Cooper Industries, Inc., 2009:1-6.

Solid-State Downlighting Calculite, MKA Brochures, Philips Lightolier, Koninklijke Philips Electronics N.V., 2009:1-14.

Lynk Labs XyLite AC LED module, Green lighting technologies, Lynk Labs, 2008:1-4.

Lynk Labs awarded AC LED technology patent, LEDs Magazine online, Penwell Corporation, Feb. 11, 2009:1-2 File://D:\LED\Lynk Labs\LEDs Magazine—Lynk Labs awarded AC LED technology patent.htm.

Lynk Labs Tesla AC LED, Green lighting technologies, Lynk Labs, 2008:1-4.

4" LED Downlight Round RGB, Renaissance Lighting, 2009:1.

LR4 4" Recessed Architectural Downlight, Cree LED Lighting Solutions, 2009:1-2.

LR6 6" Downlight Module, Cree LED Lighting Solutions, Cree, Inc., 2009:1-2.

High Performance LED Downlighting, Gallium LED Lighting Systems, GS6 Series Presentation, Gallium Lighting LLC., 2008:1-6.

6" Square LED Downlight—High Performance GS6-CXRE, Gallium LED Lighting Systems, Gallium Lighting LLC., 2008:1-2.

Recessed LED Downlights, Lit-Juno-RecessLed Literature, Juno Lighting Inc., 2009:1-16.

DOM LED Downlighting, Lithonia Lighting, Acuity Brands Lighting, Inc., 2009:1-6.

OM6LED, 6" LED Downlights with MesoOptics, Omega Lighting, Philips Group, 2009:1-2.

Revelation LED with MesoOptics, Omega Lighting, Philips Group, 2008:1-16.

OM4LED 4" LED Downlights with MesoOptics, Omega Lighting, Philips Group, 2009:1-2.

Technology and Applications of LEDs, LEDs Magazine online, Penwell Technology Group, 2009: 1-3 Downloaded http://www.ledsmagazine.com/features/3/5/2.

* cited by examiner

RECESSED LED DOWN LIGHT

BACKGROUND OF THE INVENTION

1. Field of the Invention

The present invention relates to recessed light fixtures, more specifically to LEDs used in recessed down light fixtures.

2. Description of Related Art

Recessed light fixtures are known, and are typically used when it is desirable to minimize the projection of the light fixture below the ceiling surface. Recessed light fixtures, as opposed to light fixtures that substantially extend below the ceiling surface, tend to be more aesthetically appealing and provide a cleaner look when installed. Thus, recessed light fixtures tend to be used in commercial settings such as offices and the like.

Light emitting diodes (LEDs) have been used since the early 1970s as a reliable low energy light source for indicator lights. LEDs are generally single frequency light sources, but in the early 1990s, blue LEDs were introduced, which made it possible to generate white light by coating the blue LED die with phosphor. The first white LEDs had a high color temperature of the order of 5000° K to 6000° K and were low in power. The most common type is the familiar 5 mm LED. Around the year 2000, higher power LEDs from 1 to 5 watts became available and lower color temperature range increased to as low as 2700° K. Color rendering was low and efficacy was 30 to 50 Lumens per watt.

Today, LEDs are available for a wide range of applications. The 5 mm LED is still the most commonly used for indicators, and sometimes for illumination. Single die power LEDs produce in excess of 5 watts of power at an efficacy of 50 to 100 lumens/W, depending on color temperature and CRI (Color Rendering Index). As a general rule, the lumen output drops as the color temperature is reduced and CRI increased. Both CRI and color temperature are functions of the phosphor coatings that are applied to the blue LED die.

Power LEDs are also constructed from multiple lower power dies that are wired on the same substrate. Multi-die LEDs may offer a higher efficacy than single die LEDs. These lower power dies, of the order of 70 to 100 mW, are very efficient when powered one at a time, and may be packaged individually as a Miniature Power LED.

General illumination has been driven primarily by incandescent bulbs and gas discharge tubes, including fluorescent, and Ceramic Metal Halides. Gas discharge tubes were introduced as a low energy light source to replace incandescent. They also offered a longer operating life. Had it not been for their higher CRI, simple design and lower cost, incandescent lamps would have long been extinct.

LEDs are available today in color temperatures ranging from 6000° K to 2700° K, and as high as 98 CRI. Day light and low voltage halogen incandescent lamps have a CRI of 100. As mentioned earlier, the LED lumen output drops as the CRI of a white light LED is increased. This puts a limit on the maximum CRI of an LED for an optimum lumens-cost-performance. CRIs of 60 to 75 are the most common and are used in street illumination and car headlights, where color rendering is not critical. A CRI less than 85 is used in general illumination since it is compatible with the CRI of the majority of fluorescent lamps. LED lamps with a CRI of 90 or higher are considered ideal replacements of quality incandescent lamps, such as low voltage Halogen.

The efficacy of a typical power LED can reach over 100 lumens/W, which makes it a feasible replacement of both incandescent and fluorescent lamps. Like fluorescent tubes, LEDs are current driven devices, except that an LED is driven by a DC current at a lower voltage. If the light output of an LED is required to be constant against input power changes, the drive current should be regulated, otherwise, the LED drive DC current may be allowed to vary, provided it does not exceed the maximum rating.

LED drivers may require isolation from AC line voltage for safety, especially if the LEDs are accessible. If the LEDs are encased in an approved dielectric barrier, electrical isolation will not be required, and LEDs may be driven directly from AC sources.

While incandescent lamps rely on heat and high temperature to produce light, LEDs produce light from changes in quantum energy levels of electrons in the LED semiconductor chip. However, LEDs, like all electronic devices, are not without losses, where heat is generated as a by-product, and needs to be dissipated before it causes excessive rise in LED junction temperature.

Dissipating LED heat becomes more critical as the LED is driven closer to its maximum rating. This is usually the case when maximum light output is required by design, which comes with the penalty of lower life and higher losses.

Critical heat dissipation can be avoided by reducing the amount of heat generated. This is accomplished by reducing the light output of the LED, which also improves the efficacy and increases the life of the LED.

The manufacturing process of white light LEDs yields a wide variance in voltage, luminosity, and color temperature. Each packaged LED goes through a series of tests and is ranked in "Bins" according to performance. There are three main bins commonly used today: voltage, lumen output, and color temperature. Of the three, color temperature is the most critical, since it is readily detected by the human eye. Each color temperature bin is approximately 200° K apart from an adjacent bin on the chromaticity chart.

BRIEF SUMMARY OF THE INVENTION

In an embodiment of the present invention, a light emitting diode (LED) recessed down light fixture comprises a housing having four side panels and a top panel. The LED recessed down light fixture further comprises a bottom frame that is attached to the housing. The bottom frame has an aperture with a reflector assembly mounted to the housing through the aperture. The LED recessed down light fixture further comprises an LED circuit board attached to the inside of the top panel of the housing over the reflector assembly. The LED circuit board includes a plurality of resistors electrically connected to the LED circuit board, a bridge rectifier electrically connected to the LED circuit board for converting AC power to DC power, and a plurality of at least 80 miniature LEDs electrically connected to the LED circuit board and configured to provide light. The plurality of miniature LEDs are separated into a plurality of LED clusters. Each cluster is electrically connected to at least one resistor. Further, the plurality of miniature LEDs are arranged in a configuration such that a voltage differential across any two proximate LEDs is less than 36 volts. The LED recessed down light fixture further comprises a lens cover attached to the top end of the reflector assembly configured to cover the LED circuit board.

Additionally, in another embodiment, the plurality of miniature LEDs are arranged in a configuration such that the voltage differential across any two proximate LEDs is less than 24. In another embodiment, the plurality of miniature LEDs are arranged in a circular pattern configured to provide an appearance of a single light source. In another embodiment, each LED cluster includes at least 20 miniature LEDs and wherein the LED circuit board includes at least 4 LED clusters. In a different embodiment, each LED cluster includes at least 42 miniature LEDs and wherein the LED circuit board includes at least 6 LED clusters. The LED circuit board may further comprise a plurality of capacitors electrically connected to the circuit board. The LED circuit board may also include a surge suppressor to protect against voltage surges.

In another embodiment, the lens cover of the LED recessed down light includes a lens that focuses the light from the LEDs into the reflector assembly. This lens may be an optical lens. Additionally, a reflector ring collects the light emitting from the side of the LEDs and re-directs the stray light through the lens and reflector assembly.

In another embodiment, the LED recessed down light fixture further comprises a junction box mounted to one side of the side panels of the housing and a divider attached to the frame located between the aperture and the junction box. The light fixture may also further comprise an external capacitor electrically connected to the LED circuit board and mounted inside a junction box. The light fixture may also include a plurality of mounting brackets attached to the side panels of the housing. The light fixture further comprises a thermal protector located within the housing and configured to stop power when the thermal protector detects excessive heat within the housing.

In another embodiment, the LED recessed down light fixture further comprises a heat sink mounted on top of the top panel of the housing. The height of the light fixture with the heat sink mounted is no more than ¼ inch taller than the height of the light fixture without the heat sink mounted. The heat sink comprises a flat member mounted to the top panel of the housing and a fin member that extends horizontally from the flat member and the front panel of the housing. Additionally, the fin member of the heat sink comprises a set of vertical fins and horizontal fins configured in a square wave pattern.

In another embodiment of the present invention, a light emitting diode (LED) circuit board connected to an AC power source and used for a recessed down light fixture comprises a plurality of resistors electrically connected to the LED circuit board, a bridge rectifier electrically connected to the LED circuit board for converting the AC power to DC power, and a plurality of at least 80 miniature LEDs electrically connected to the LED circuit board. The LEDs are configured to provide an appearance of a single light source. Additionally, the LEDs are separated into a plurality of LED clusters, with each cluster electrically connected to at least one resistor. The plurality of miniature LEDs are arranged in a configuration such that a voltage differential across any two proximate LEDs is less than 36 volts.

In another embodiment of the present invention, a light emitting diode (LED) circuit board connected to a power source used for a recessed down light fixture comprises a plurality of resistors electrically connected to the LED circuit board, a bridge rectifier electrically connected to the LED circuit board, a pair of fuses electrically connected to the LED circuit board, and a plurality of miniature LEDs electrically connected to the LED circuit board. The pair of fuses includes a first fuse and a second fuse. The plurality of miniature LEDs provide a light source in one of two factory-selectable modes. A first mode, a high light output, is operable with the second fuse preinstalled. A second mode, a low light output, is operable with the second fuse not preinstalled

BRIEF DESCRIPTION OF THE DRAWINGS

The present invention is illustrated by way of example and not limited in the accompanying figures in which like reference numerals indicate similar elements and in which.

DETAILED DESCRIPTION OF THE INVENTION

As is apparent from the Figures described above and the description provided below, various components are disclosed below and may be mounted to other components. Unless otherwise noted, mounting may be direct or indirect and this disclosure is not intended to be limiting in this respect. It is noted that various components are described below as separate components. Unless otherwise noted, two or more of these components may be combined to form a single component as appropriate and this disclosure is not intended to be limiting in this respect unless otherwise noted.

Various features are described below in greater detail. It should be noted that different combinations of these features may be combined as desired to generate LED down lights with more or less features, depending on the features that are needed. Thus, unless otherwise noted, it is envisioned that additional LED down lights using combinations of the below depicted features are potentially within the scope of the present invention.

Figure 1:
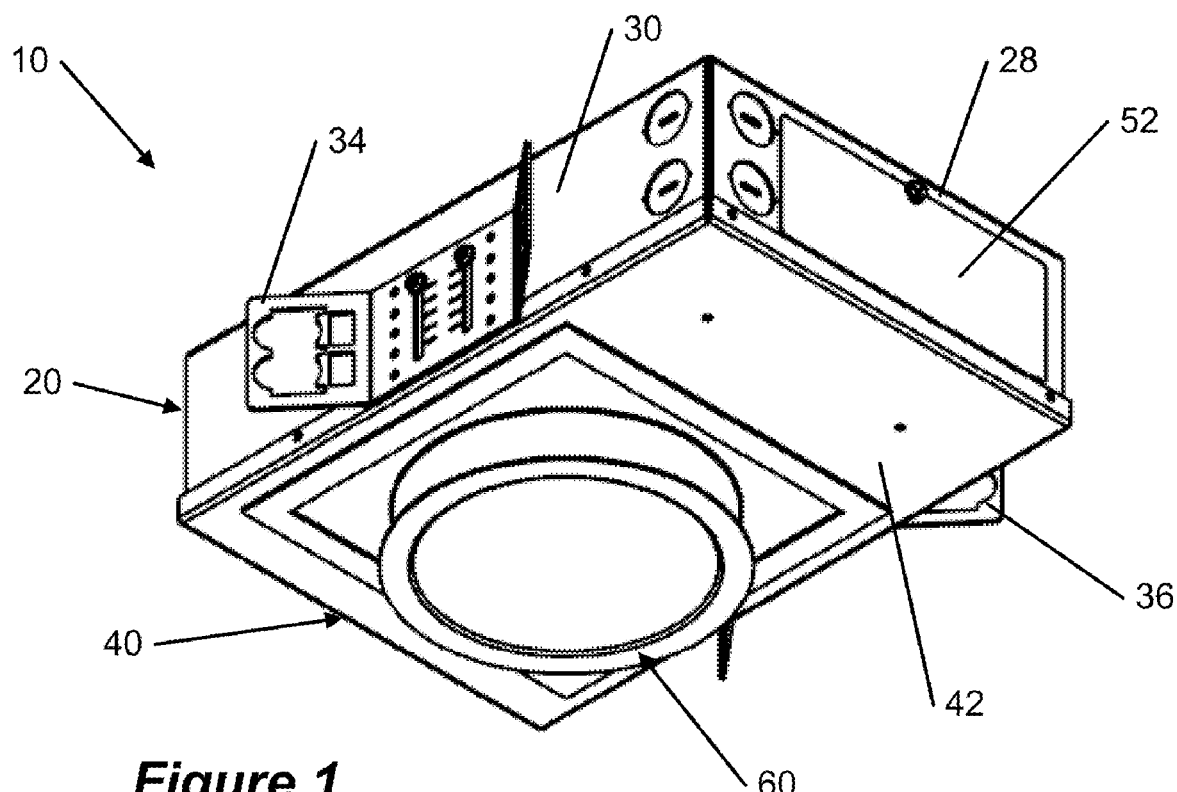
FIG. 1 is an illustration of a bottom isometric view of an embodiment of the assembled light fixture.
Figure 2:
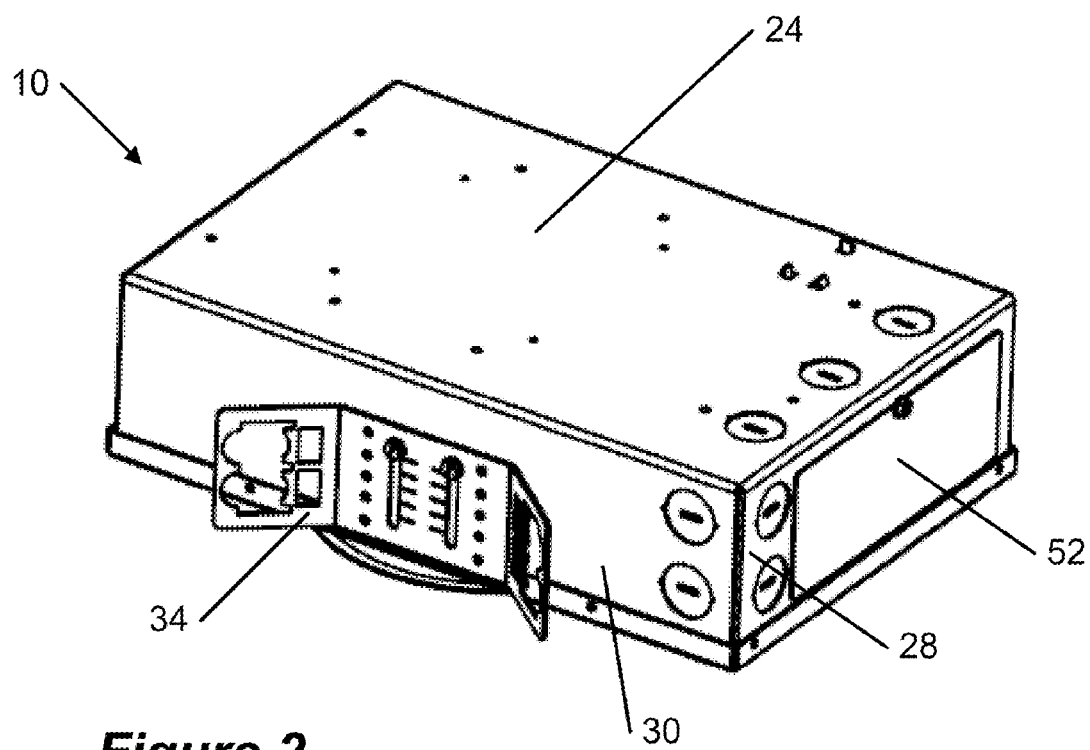
FIG. 2 is an illustration of a top isometric view the light fixture depicted in FIG. 1 from an angle approximately opposite the angle of view of FIG. 1.

FIGS. 1 and 2 are illustrations of an exemplary embodiment of a recessed down light fixture 10. As depicted, the light fixture 10 comprises a housing assembly 20, a frame assembly 40, a reflector assembly 60, and a lens assembly 70. The light fixture 10 also utilizes a light-emitting diode (LED) circuit board 100 with a plurality of LEDs 120 to provide the light source. The preferred construction, as described below, provides an aesthetically pleasing light fixture 10 that is capable of providing excellent functionality while reducing manufacturing costs. Thus, the preferred embodiment provides numerous advantages over fixtures of the prior art.

The housing assembly 20 includes a housing 22 which includes a top panel 24, a front panel 26, a back panel 28, and two side panels 30, 32. The housing 22, which may be made of any desirable material, such as but not limited to aluminum or steel, provides a certain level of protection for the light fixture 10 and LEDs 120 and also can protect the surrounding area from heat produced by the light fixture 10. The front panel 26, back panel 28 and two side panels 30, 32 create a rectangular-shaped housing. Additionally, the top panel 24 is attached to the top of each of the front panel 26, the back panel 28, and the two side panels 30, 32 to complete the structure of the housing 22.

The housing assembly 20 may also include mounting brackets 34, 36 which may be attached to the side panels 30, 32 of the housing 22. The mounting brackets 34, 36 may be attached to the housing 22 via a connector, such as a screw or bolt. Additionally, the mounting brackets 34, 36 may be of a butterfly-style mounting bracket to provide optimum flexibility for installing the light fixture 10.

The frame assembly 40 may consist of a bottom frame 42 and a junction box 44. The frame 42 may be flat and attached to the housing 22 at the bottom of the front panel 26, the back panel 28 and the two side panels 30, 32. The frame 42, which may be made of any desirable material, such as but not limited to aluminum or steel, helps to provide a certain level of protection for the light fixture 10 and LEDs 120 and also can protect the surrounding area from heat produced by the light fixture 10.

As shown in FIGS. 3-6B, the frame 42 has an aperture 46 which may generally be in the shape of a circle. However, the aperture 46 may be other shapes as required or designed, such as a square, a rectangle, or other polygons. Generally, the aperture 46 will match the shape and size of the pattern of the LEDs 120 on the LED circuit board 100, however, this is not always the case, and a square aperture may use a round LED pattern, and vice versa.

Additionally, as shown in FIGS. 3-6B, a divider 48 may be attached or mounted to the frame 42 proximate to the aperture 46. This divider 48 may be positioned vertically along the frame 42. The divider 48 may be used to help separate the area for the LEDs 120 and the junction box 44. The junction box 44 may be located on one side of the light fixture 10. Additionally, the junction box 44 may have one or more doors 50, 52 located on the divider 48 and/or on the back panel 28 of the housing 22. The doors 50, 52 provide access to the electrical connections within the housing assembly 20. The divider 48, junction box 44, and junction box doors 50, 52 may be made of any desirable material, such as but not limited to aluminum or steel.

In one embodiment, a thermal protector 54 may be attached to the top panel of the housing 24. The thermal protector 54 is used to protect the housing 22 and LED down light 10 against excessive heat within the housing 22. If the thermal protector 54 detects excessive heat, which may be for example, 100° C., within the housing 22, the thermal protector 54 will trip thereby shutting down the power to the LED circuit board 100. This feature protects against abnormal applications, such as high ambient temperature, or high input line voltage, and keeps the LED junction temperature under the maximum rated for 50,000 hours life.

As shown in FIGS. 3-6B, the reflector assembly 60 is mounted within the frame 42 and housing assembly 20. The reflector assembly 60 is generally conically shaped with two circular ends, a top end 62 and a bottom end 64. The reflector assembly 60 may also be shaped in different shapes, such as square, wherein the reflector assembly may have two square ends, or one end square and the other end round. The top end 62 may be smaller than the bottom end 64. The top end 62 of the reflector assembly 60 may be sized such that the top end fits 62 within the aperture 46 of the frame 42 allowing the reflector assembly 60 to slide through the aperture 46 of the frame 42 and into the housing 22. The top end 62 of the reflector assembly 60 may be proximate to the lens assembly 70 and the LED circuit board 100 within the housing 22.

Figure 3:
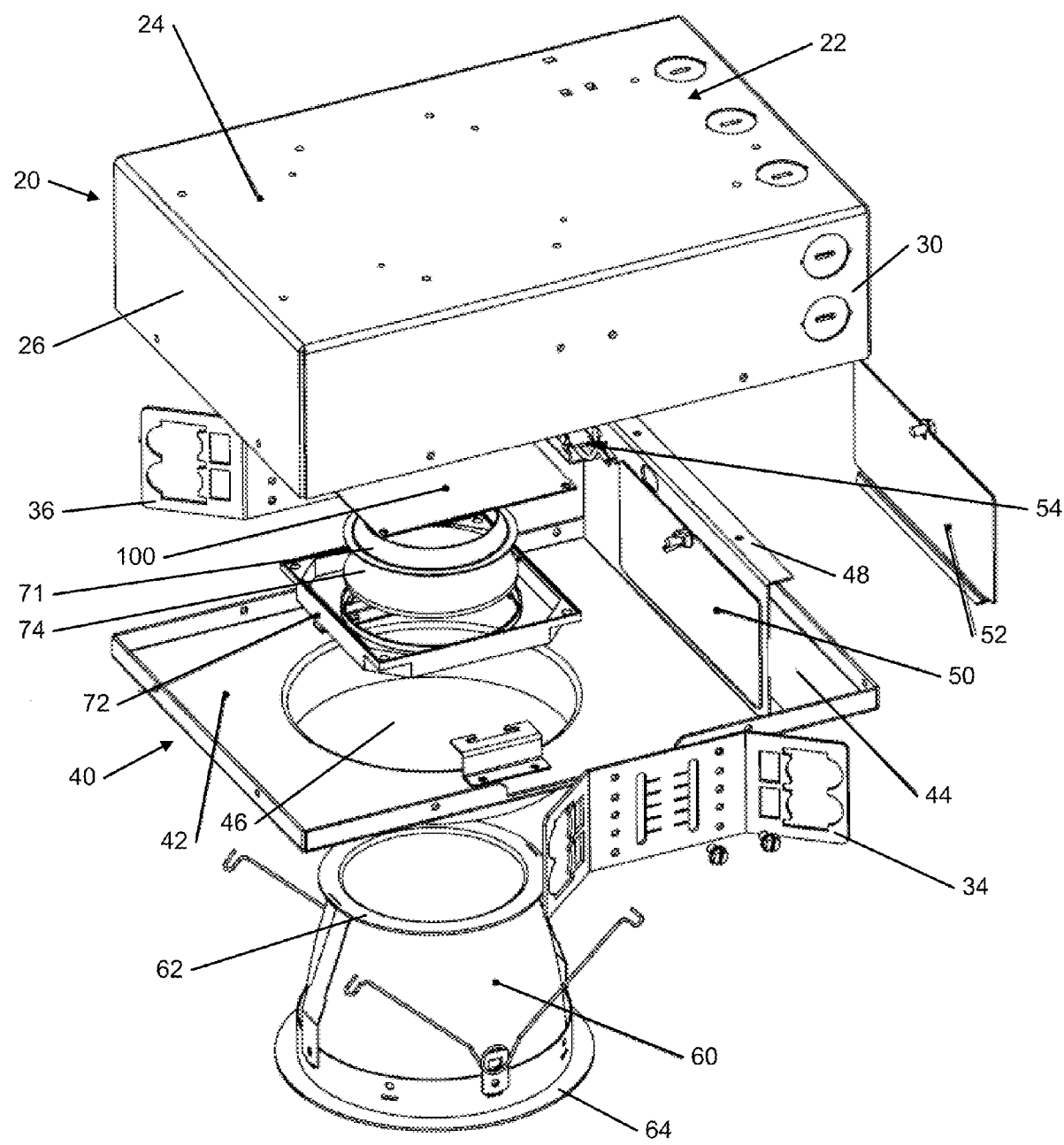
FIG. 3 is an illustration of a partially exploded isometric view of the light fixture depicted in FIG. 1.

As shown in FIG. 3, the lens assembly 70 may be positioned over the top end 62 of the reflector assembly 60. As is shown in further detail in FIG. 7, the lens assembly 70 may include a lens reflector 71, a lens cover 72, and an optical lens 74. The lens cover 72 is provided to cover the LED circuit board 100. The lens cover 72 may be utilized for a number of different purposes. First, the lens cover 72 may be utilized to provide thermal isolation from the LED circuit board 100 and the external surroundings to the light fixture 10. The lens cover 72 may also be utilized to meet safety requirements to protect a user from touching or contacting the LED circuit board 100. The LED circuit board 100 may be electrically charged and can create a serious shock to a user who might be able to touch the LED circuit board 100. The lens cover 72 provides the protection to the user from this kind of shock. Third, the lens cover 72 provides protection to the LED circuit board 100 from debris, or dust that could possibly damage the LED circuit board 100.

Additionally, the lens cover 72 is configured to hold the optical lens 74. The optical lens 74 may be a glass lens. The optical lens 74 may be frosted, clear, prism, or other characteristics depending on the requirements of the LED down light 10. The optical lens 74 provides may provide thermal isolation from the LED circuit board 100 and the external surroundings to the light fixture 10. The optical lens 74 may also protect a user from touching or contacting the LED circuit board 100. Additionally, the optical lens 74 may provide protection to the LED circuit board 100 from debris, or dust that could possibly damage the LED circuit board 100.

Figure 7:
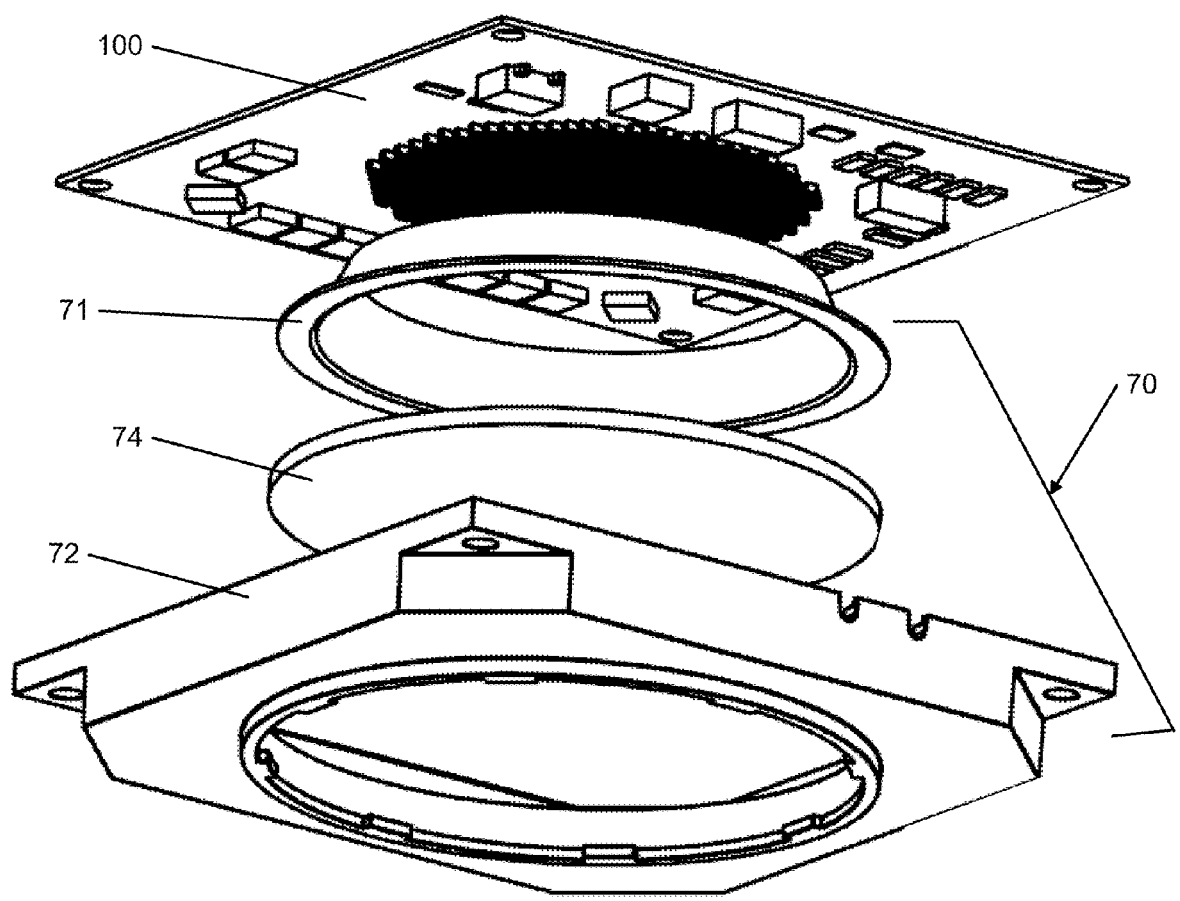
FIG. 7 is an illustration of a partially exploded isometric view of the lens assembly depicted in FIG. 3.
Figure 8A:
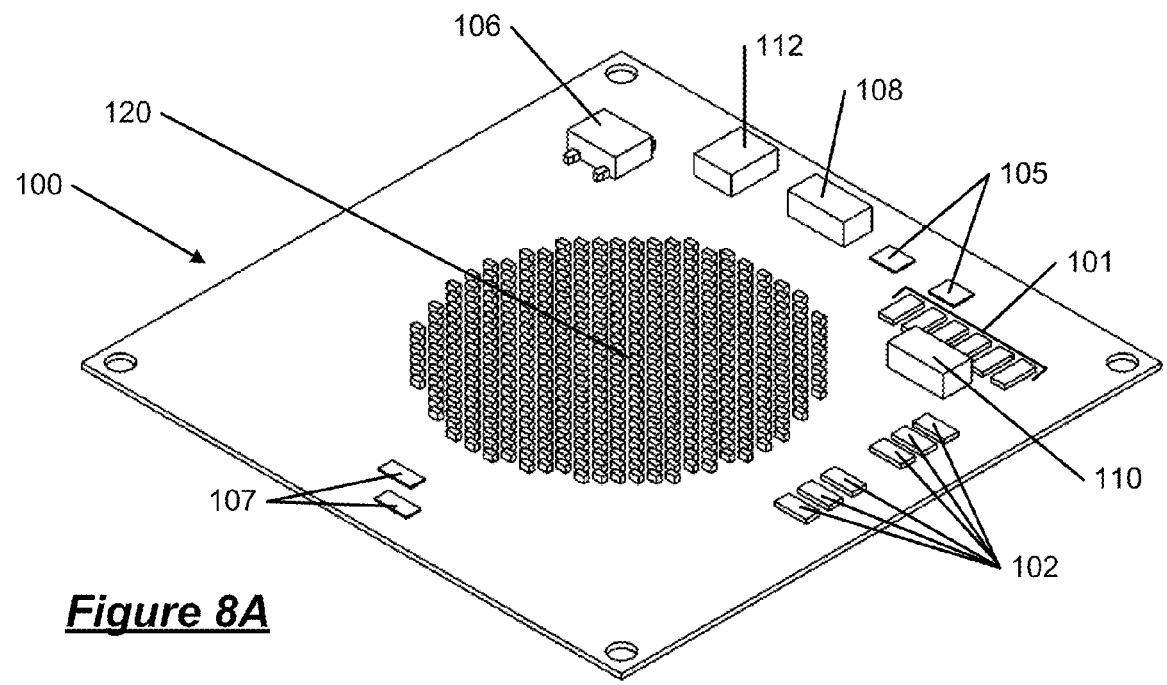
FIG. 8A is an illustration of an isometric view of a first embodiment of the LED circuit board.
Figure 8B:
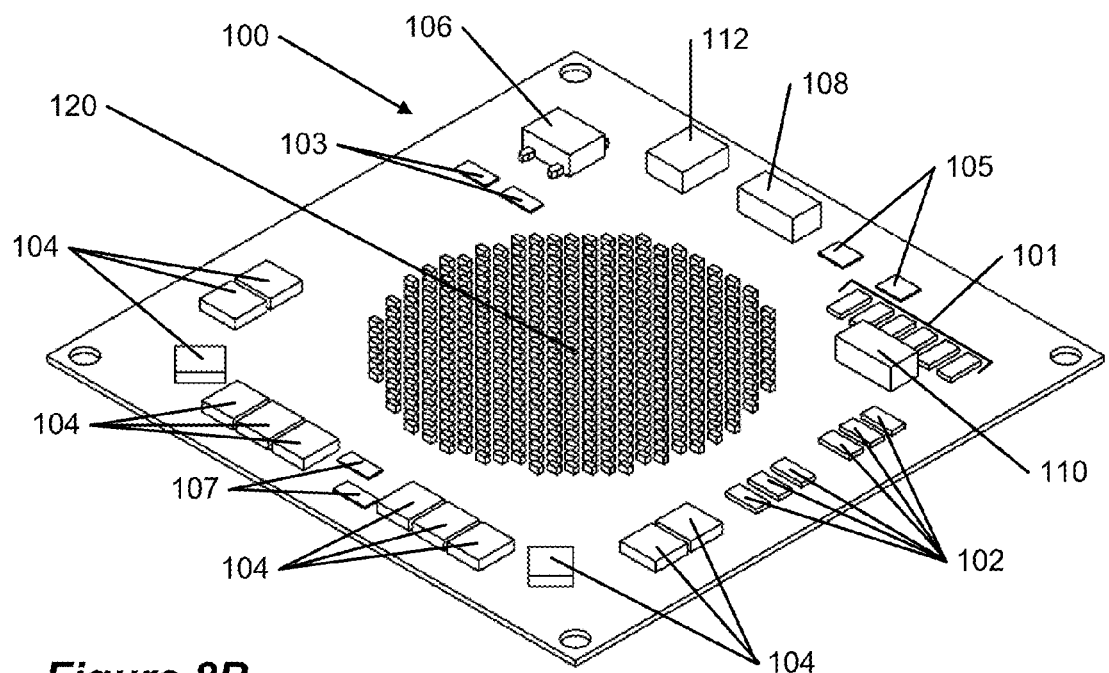
FIG. 8B is an illustration of an isometric view of a second embodiment of the LED circuit board.

As is depicted in FIG. 7, the lens reflector 71 is located on top of the optical lens 74 and next to the LED circuit board 100. The lens reflector 71 is designed to help focus and direct light from the LEDs 120 through the hole in the lens cover 72 toward the reflector assembly 60. In an embodiment, the lens reflector 71 collects all the light beams, including side light and stray light from the LEDs 120. Additionally, while the reflector assembly 60 is provided to provide visual shielding for the light fixture 10, the lens reflector 71 is provided to help focus the beam of light through the reflector assembly 60 to reduce the light bouncing on the inside of the reflector surface.

Figure 4:
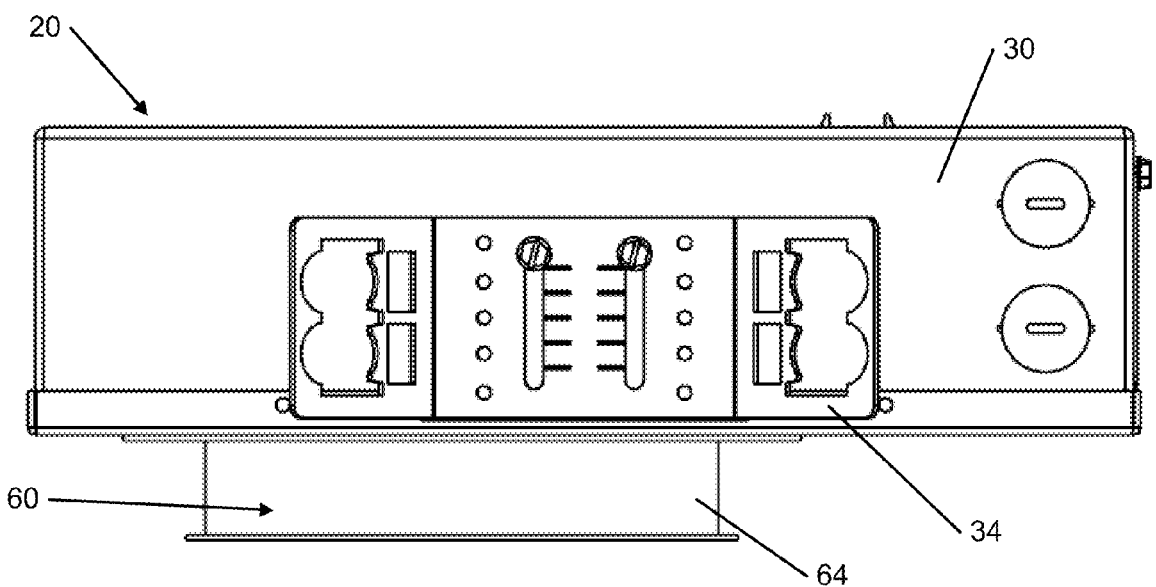
FIG. 4 is an illustration of a side plan view the light fixture depicted in FIG. 1.
Figure 5:
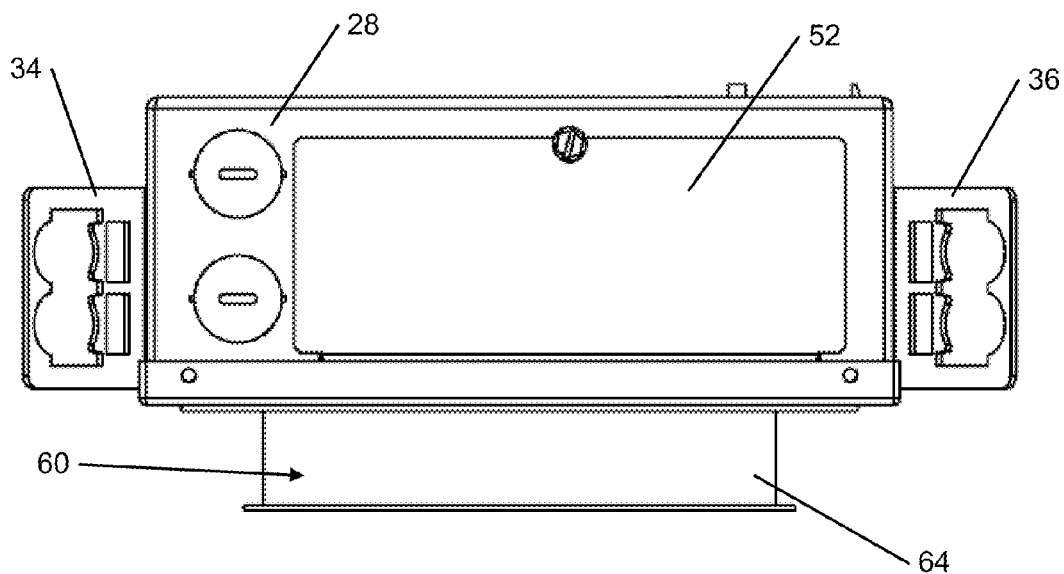
FIG. 5 is an illustration of a back plan view of the light fixture depicted in FIG. 1.
Figure 6A:
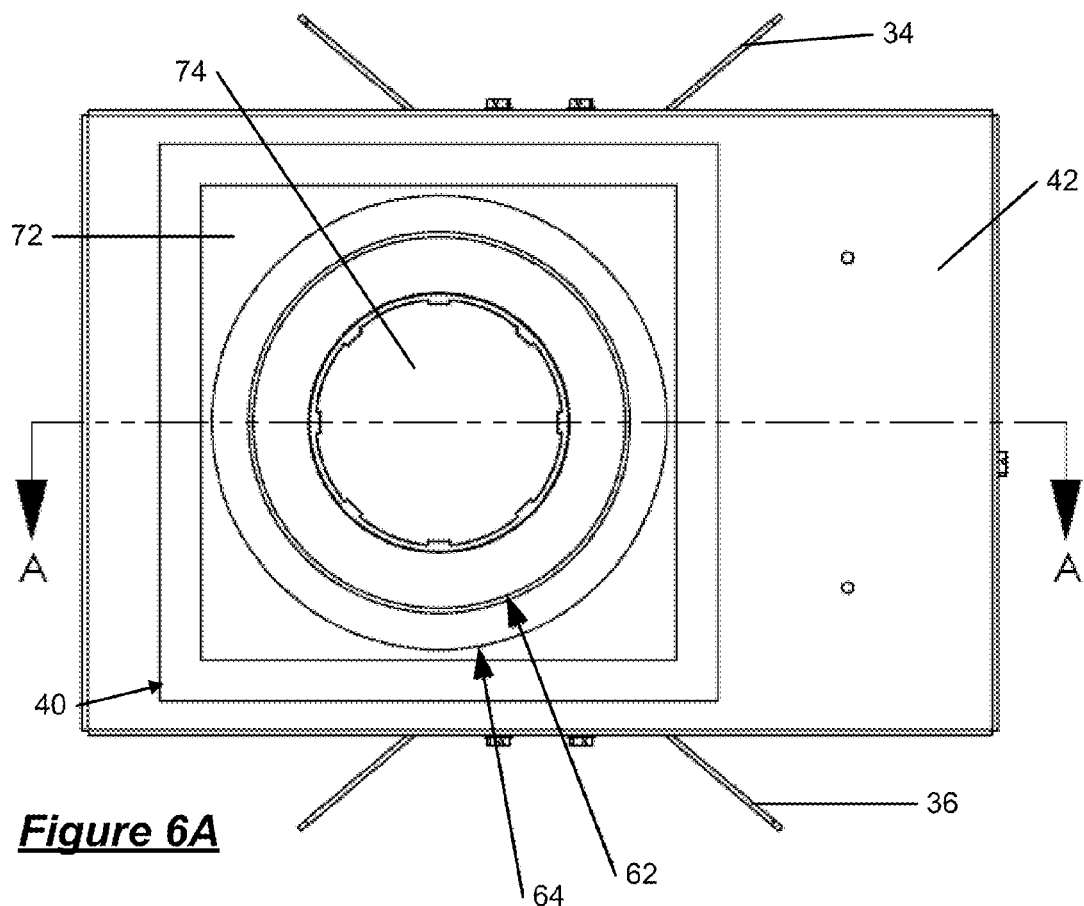
FIG. 6A is an illustration of a bottom plan view of the light fixture depicted in FIG. 1.
Figure 6B:
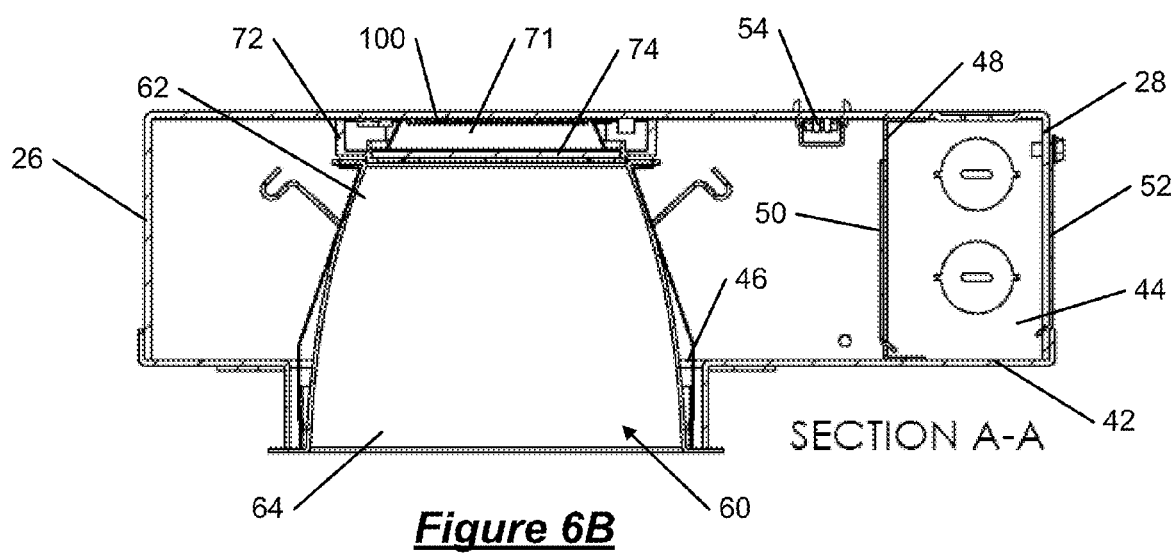
FIG. 6B is a cross-sectional view along section A-A of the light fixture depicted in FIG. 6A.

As shown in FIGS. 4 and 5, the bottom end 64 of the reflector assembly 60 protrudes from the housing assembly 20. In one embodiment, the bottom end 64 of the reflector assembly 60 protrudes approximately one inch from the housing assembly 20. However, the bottom end 64 of the reflector assembly 60 could protrude more or less from the housing assembly 20, as dictated by the design and aesthetic requirements.

The LED circuit board 100, as shown in FIG. 8A, 8B, 9A, and 9B, may be fabricated from either an FR-4 (Flame Retardant 4) board or a metal core board, depending on performance requirements and cost considerations. Generally, the LED circuit board 100 fabricated with the metal core board provides better thermal dissipation but is generally more expensive. An FR4 board is generally lower in cost, but is lower is thermal conductivity. Additionally, the LED circuit board 100 may be fabricated using other printed circuit board materials.

The LED circuit board 100 may consist of a number of different electrical components which may be electrically connected together. As shown in FIGS. 8A, 8B, 9A, and 9B, the LED circuit board 100 may consist of resistors 101, 102, 103, capacitors 104, a bridge rectifier 106, fuses 108, 110, surge suppressors 112, and miniature LEDs 120. Each of these components is electrically connected together, and may or may not be used with different embodiments of this invention. The LED circuit board 100 may also include terminals for AC input 105 and terminals to connect remote capacitors 107.

The LED circuit board 100 includes a plurality of miniature LEDs 120. In one embodiment, there may be as many as 252 individual miniature LEDs 120. However, depending on the design and aesthetic requirements, more or fewer individual miniature LEDs 120 may be used. One possible LED is the Citizen CL-822. This LED is a 0.09 W LED at 3V (typical) with a running maximum current of 30 mA that comes in color temperatures of 6000° K, 4100° K, 3500° K, and 2800° K. This LED may have a CRI of 91, but 85 or less is also available. The LED board may be all one color temperature from one bin, or one color temperature from several bins, or different color temperatures from different bins. Mixing same color temperature bins will ensure tighter variance when the light engine goes to production, while adding other color temperatures, such as 4100° K, to a 3500° K bin mix, will push the average LED light engine color temperature slightly higher. This will be the case if it is determined that the LED color temperature distribution has a mean lower than 3500° K. Tests based on a small sample have shown that the mean color temperature is between 3300° K and 3400° K. Another application is to control the intensity of the different LED color temperatures to dial in a desirable average color temperature. The intensity of the different LED color temperatures can also be controlled by switching series resistors. Different color temperature LED clusters can be dimmed in a weighted manner where the higher temperature LEDs are dimmed at a higher rate than lower temperature LED clusters, the net effect of which would be a reduction of the color temperature as the light is dimmed, matching a desirable characteristic of incandescent lamps.

As shown in FIGS. 8A, 8B, 9A, and 9B, the LEDs 120 may be arranged in a circular pattern configured to provide an appearance of a single light source. This appearance of a single light source gives the user of the LED down light 10 the perception that the LED down light 10 is just one light source, instead of 252 lights or dots. Additional patterns of LEDs 120 may be used as required by aesthetic design or performance requirements.

Figure 10A:
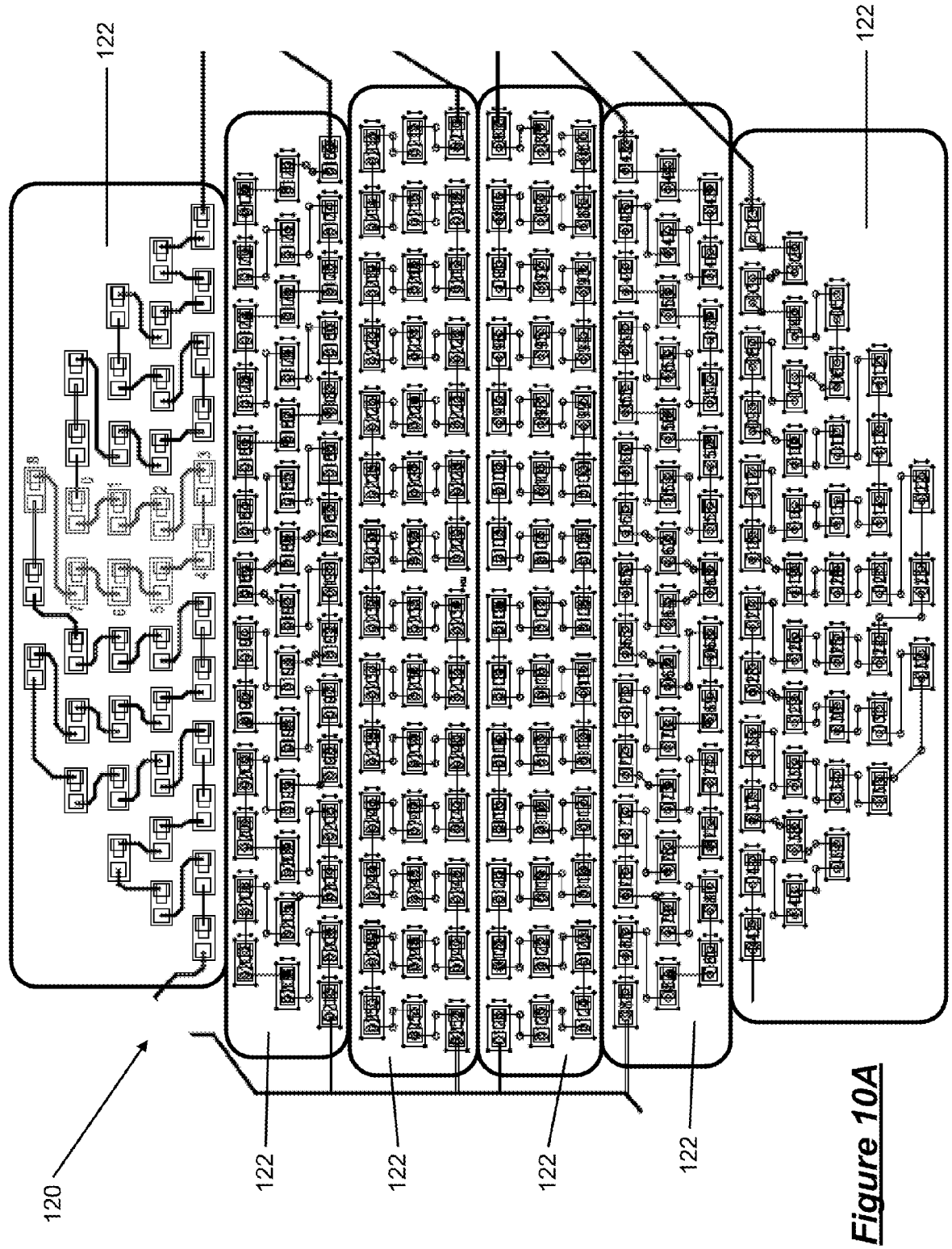
FIG. 10A is a close-up top plan view of the LEDs on the LED circuit board.

The LEDs 120 may be separated into a number of LED clusters or strings of LEDs 122 as shown in FIG. 10A. For each LED cluster 122, the LEDs 120 may be electrically connected to each other in series. Each LED cluster 122 may be electrically connected to a resistor to limit the current to each individual LED 120. Each LED cluster 122 may be arranged in a layout that starts from one end of the board and terminates on the other end, such that the potential differential between any two adjacent LEDs is no more than 24 Vdc. This configuration, as depicted in one embodiment of the present invention, is when the current flows from one LED to the next in a pattern, as illustrated in FIG. 10A. Additional configurations may provide a design in which the potential differential between any two adjacent LEDs is no more than 36 Vdc, which is still an acceptable voltage differential to avoid arcing or stress to the LED circuit board 100.

Because the LEDs 120 are arranged in the circular pattern and are in close proximity to each other, the LEDs 120 must have a voltage differential which provides a safe, low voltage that does not cause stress on the circuit or arcing across the traces of the LEDs 120. LEDs 120 that are proximity located to each other and have a high voltage differential across them may arc or stress the circuit which may lead to failure. To achieve the desired safe, low voltage, the LEDs 120 are arranged and electrically connected by LED clusters 122 to minimize the voltage differential across proximate LEDs. In one embodiment, the LED clusters 122 are arranged from the first LED to the last LED in a pattern, as shown in FIG. 10A. As can been seen in FIG. 10A, each LED cluster 122 is arranged in a special layout pattern on the LED circuit board 100. Additionally, as, can be seen in FIG. 10A, each LED cluster 122 starts on one end of the LED circuit board 100 and ends on a different end to further ensure that no proximate LEDs are over the safe, low voltage as described above. Such voltage may be 36 or 24 volts. It is known to those of skill in the art that 36 volts is considered a voltage that is low enough to ensure no arcing in a miniature LED application such as this. It is important to note, that merely placing the LEDs 120 or even LED clusters 122 on a circuit board will most likely lead to circuit board failure, especially during line voltage surges. The LED layout pattern for clusters 122 and LED cluster design helps to ensure that the LED circuit board 100 will not fail, even during power surges.

In one embodiment, as shown in FIG. 10A, the LED circuit board 100 includes 6 LED clusters 122 with 42 LEDs 120 in each LED cluster 122 totaling 252 miniature LEDs. In another embodiment, there may be 4 LED clusters 122 with 20 LEDs 120 in each LED cluster 122, totaling 80 miniature LEDs 120. Additionally, there may be other various combinations of LED clusters 122 and number of miniature LEDs 120 per LED cluster 122.

Figure 10B:
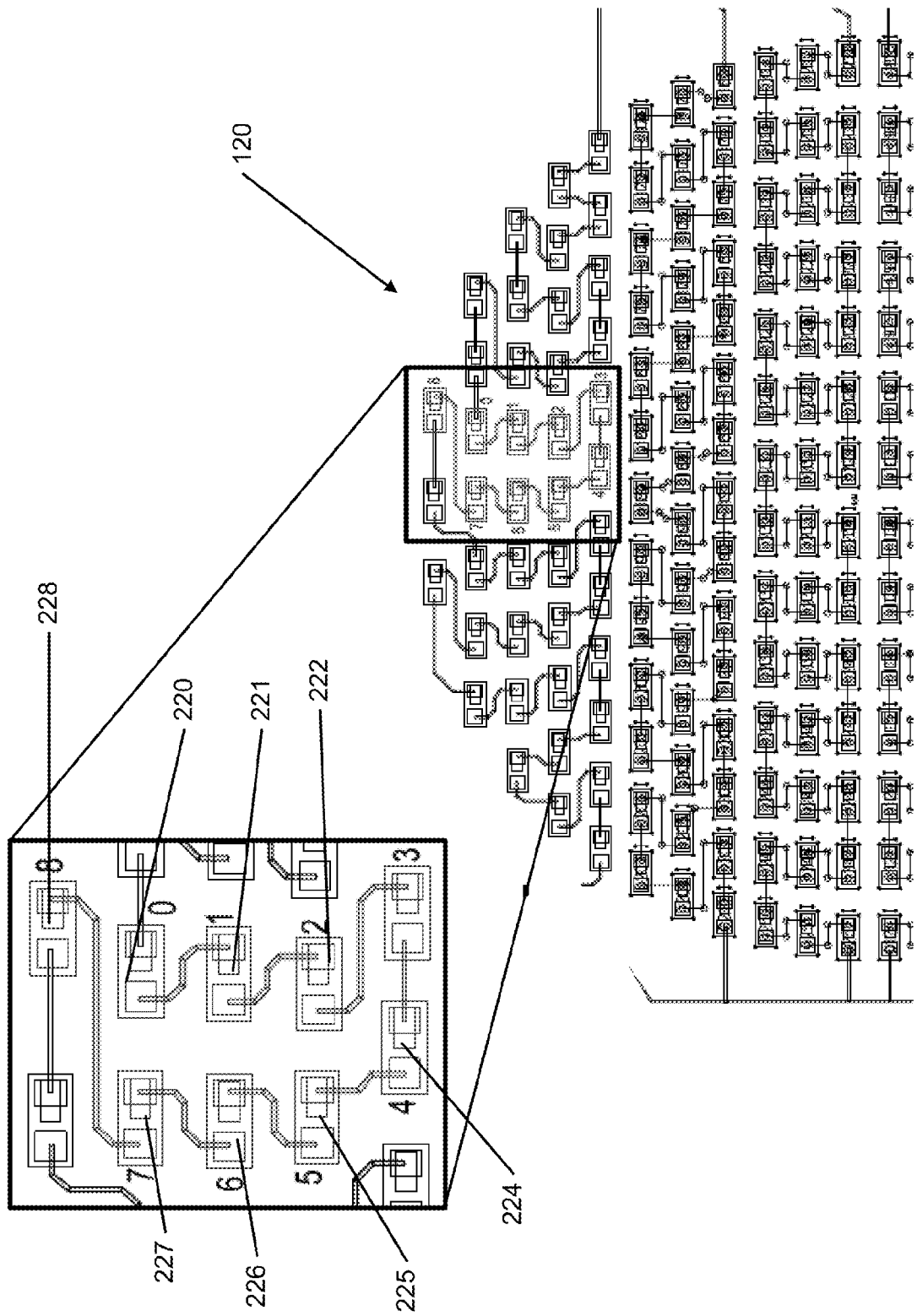
FIG. 10B is a close-up top plan view of the LEDs from FIG. 10A with a blow-up inset view of the LED configuration.

In the embodiment with 6 LED clusters 122 with 42 LEDs 120 in each LED cluster, the maximum voltage differential during normal operation across any two LEDs is 24 Vdc. The area where this maximum voltage differential may occur is depicted in detail in the inset of FIG. 10B. With the LEDs as described above, the LEDs have a typical voltage drop of 3 volts per LED. As shown in FIG. 10B, for example, the voltage at LED (8) 228 may be at a theoretical potential of 63 volts relative to ground. Therefore, it follows that the voltage at LED (7) 227 is 66 volts, at LED (6) 226 is 69 volts, at LED (5) 225 is 72 volts, at LED (4) 224 is 75 volts, at LED (3) 223 is 78 volts, at LED (2) 222 is 81 volts, at LED (1) 221 is 84 volts and LED (0) 220 is 87 volts. Therefore, the highest voltage differential of two proximate LEDs would be located between LED (0) 220 and LED (8) 228 which would be 87 volts minus 63 volts, or 24 volts. With the electrical configuration as shown in FIG. 10A, this is the maximum voltage differential of proximate LEDs throughout the entire LED configuration.

The LED circuit board 100 may be powered by a 120 volt AC electric outlet 140 as is common in any household or business. The bridge rectifier 106 may be electrically connected to the LED circuit board 100 before the AC limiting resistors and after the DC limiting resistors. The bridge rectifier 106 converts the AC current to DC current to power the LEDs 120.

The LED circuit board 100 may include resistors 101, 102, 103. There may be different uses for the resistors 101, 102, 103 on the LED circuit board 100. The DC current resistors 102 must be used to limit the current delivered to the LEDs 120 or LED clusters 122. Typically, each LED cluster 122 will have a resistor 102 electrically connected to the LED cluster 122. The resistors 103, may be used only one the capacitors 104 are used. These resistors are used to discharge the capacitors 104 when the LED light fixture 10 is turned off. Additionally, the resistors 101 are AC limiting resistors which limit the current and work in conjunction with the switching fuse 110 as explained later.

Figure 9A:
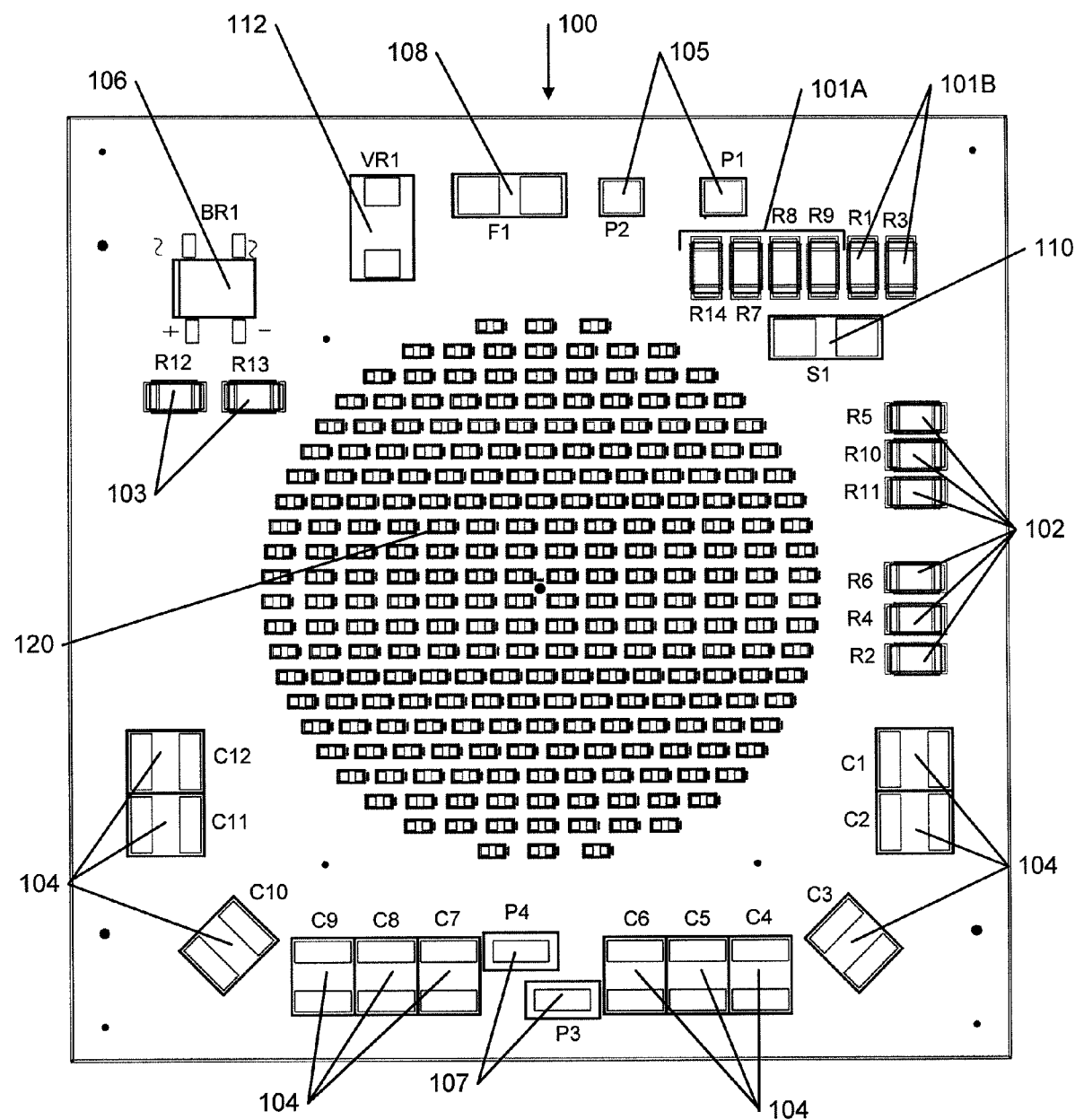
FIG. 9A is top plan view of an embodiment of the LED circuit board.
Figure 9B:
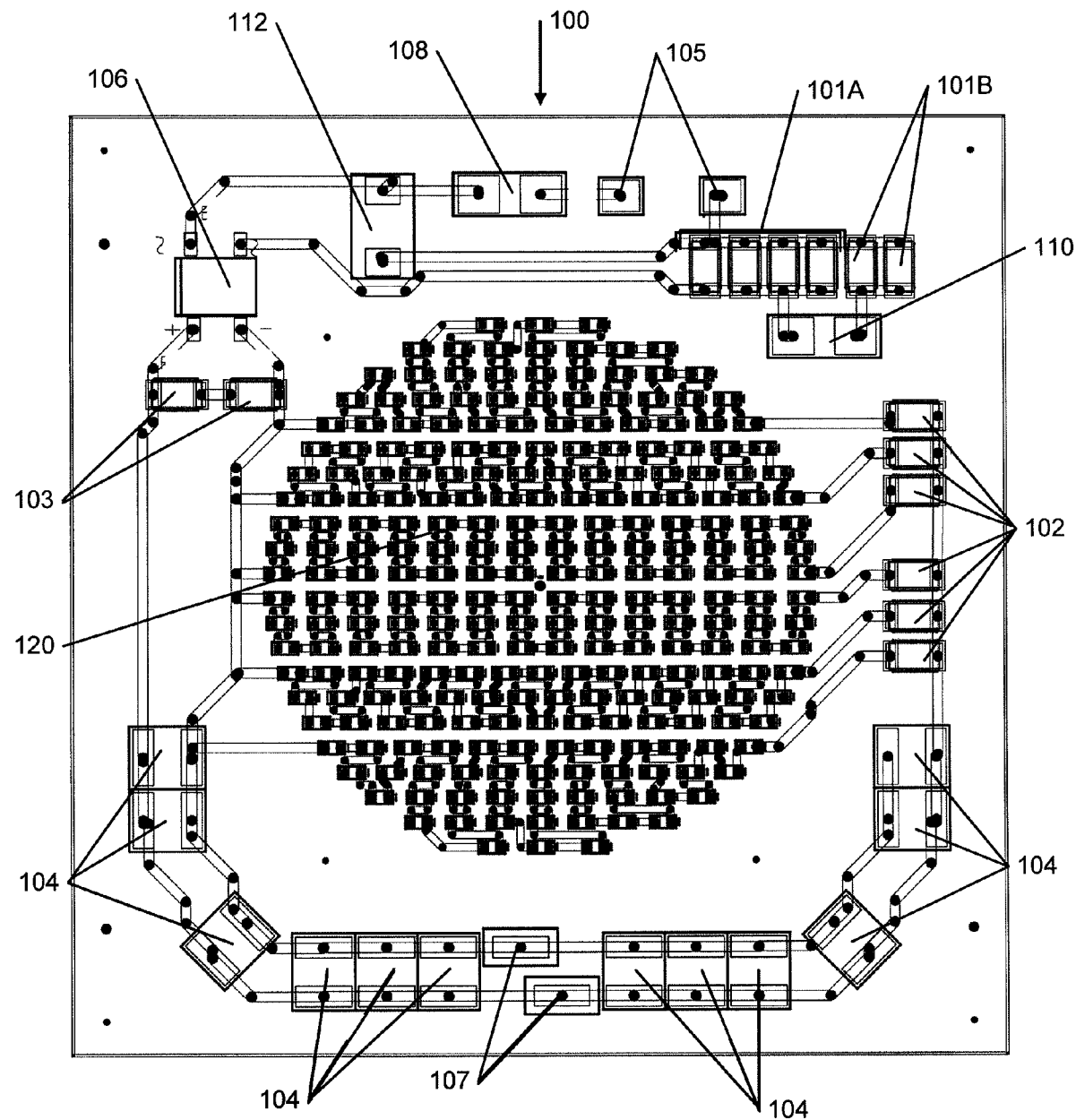
FIG. 9B is top plan view of the LED circuit board in FIG. 9A showing the electrical connections.

The LED circuit board 100 may include capacitors 104. While the LED circuit board 100 can work without capacitors, it may be desirable to electrically connect a capacitor or multiple capacitors 104. The capacitors 104 may be rated at 22-68 mFarads at 200 V max. The capacitor 104 helps to smooth out the current delivered to the LEDs 120, which in turn helps to eliminate a possible "strobe effect" with the light generated by the LEDs 120. Generally, it is adequate to electrically connect a number of capacitors 104 to the LED circuit board 100 to minimize the "strobe effect" of the LEDs 120. As shown in FIG. 9B, the capacitors 104 may be electrically connected to the LED circuit board 100 after the bridge rectifier 106 and prior to the resistors 102. Additionally, in the illustrative embodiment, twelve capacitors 104 may be used for the entire LED circuit board 100. The use of capacitors may have the side effect of reducing the input power factor of the LED circuit board 100.

In another embodiment, if the user desires to essentially eliminate the "strobe effect" from the LED light fixture 10, a higher capacitance value may be needed, which may mean a larger capacitor. Because of the space limitations on the LED circuit board 100, this large capacitor may need to be an external capacitor electrically connected to the LED circuit board 100. In this embodiment, the external capacitor may be mounted within the junction box 44 and connected to the LED circuit board 100 at the terminals 107 to provide the required capacitance to eliminate the "strobe effect." While the external capacitor may increase the system efficiency, it may also reduce the input power factor of the LED circuit board 100. In this embodiment, the internal LED circuit board capacitors 104 can remain electrically connected to the LED circuit board 100, or removed, as required by the design of the LED down light 10.

The LED circuit board 100 may also include the fuse 108 or multiple fuses 110. In the illustrative embodiment in FIGS. 8A, 8B, 9A, and 9B, the LED circuit board 100 includes two fuses, a safety fuse 108 and a switching fuse 110. As illustrated in FIG. 9B, the safety fuse 108 may be electrically connected to the LED circuit board 100 after the surge suppressor 112. The safety fuse 108 may be installed to protect the entire circuit board 110 from voltage spikes.

Additionally, the LED circuit board 100 may include the switching fuse 110. As illustrated in FIG. 9A, the switching fuse 110 may be electrically connected to the LED circuit board 100 across part of the AC limiting resistors 101A, 101B. By preinstalling the switching fuse 110, the LED circuit board 100 will operate in a high light output mode by shorting a group of the AC limiting resistors, as shown by reference number 101B. By removing the switching fuse 110, the LED circuit board 100 will operate in a low light output setting by adding more resistance in series with the AC limiting resistors 101B. By utilizing the switching fuse design, the manufacturer of the LED circuit board 100 and LED down light 10 is able to offer two different light modes, the high light output mode and low light output high efficiency mode. These modes may be factory-selectable and not user-selectable.

The LED circuit board 100 may also include the surge suppressor 112. As illustrated in FIG. 9B, the surge suppressor 112 may be electrically connected to the LED circuit board 100 before the bridge rectifier 106 and after the safety fuse 108 and switching fuse 110. The surge suppressor 112 is a device installed to prevent damage to the LED circuit board 100 and components from voltage surge.

Figure 11A:
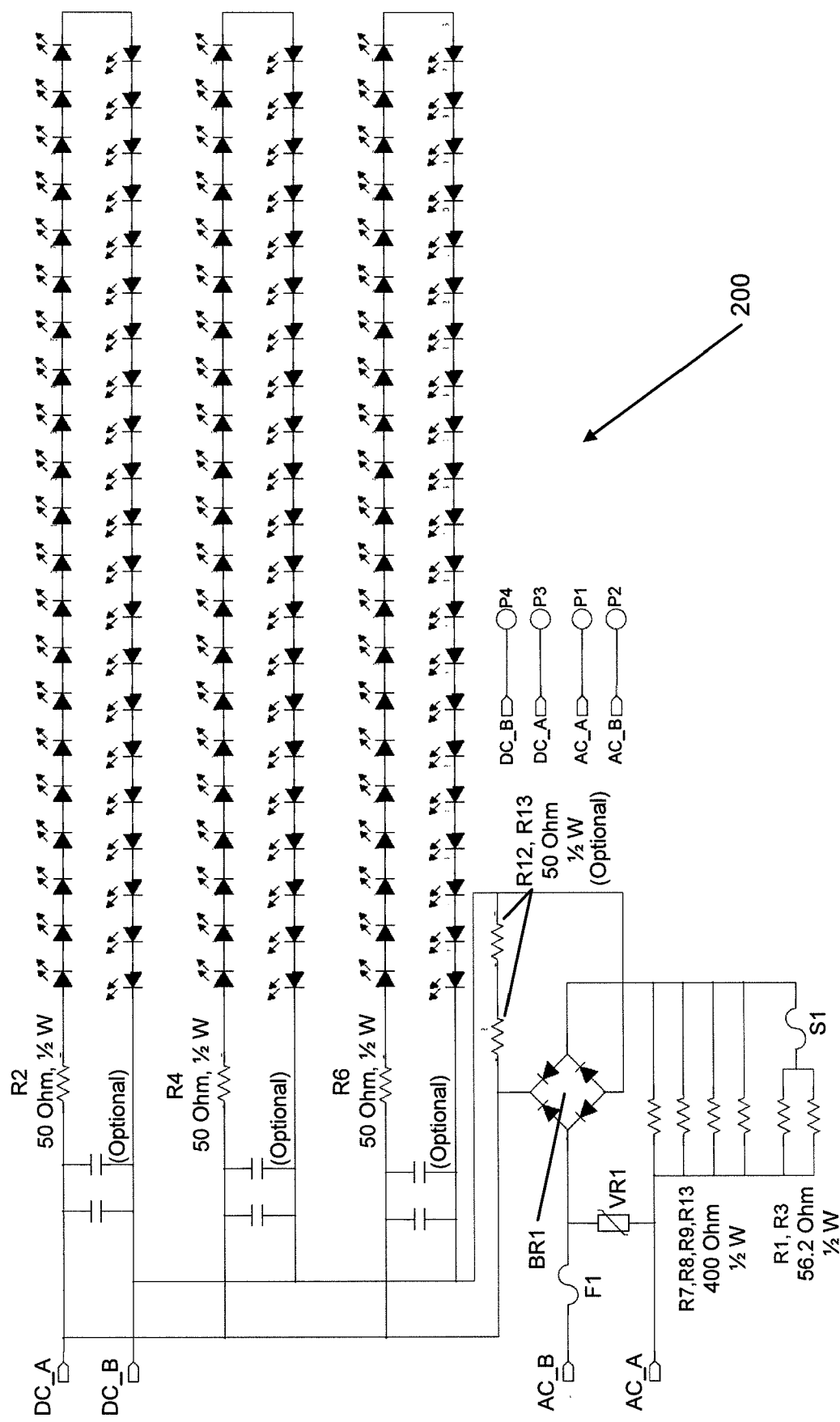
FIG. 11A is a first partial electrical wiring diagram of an embodiment of the LED circuit board.
Figure 11B:
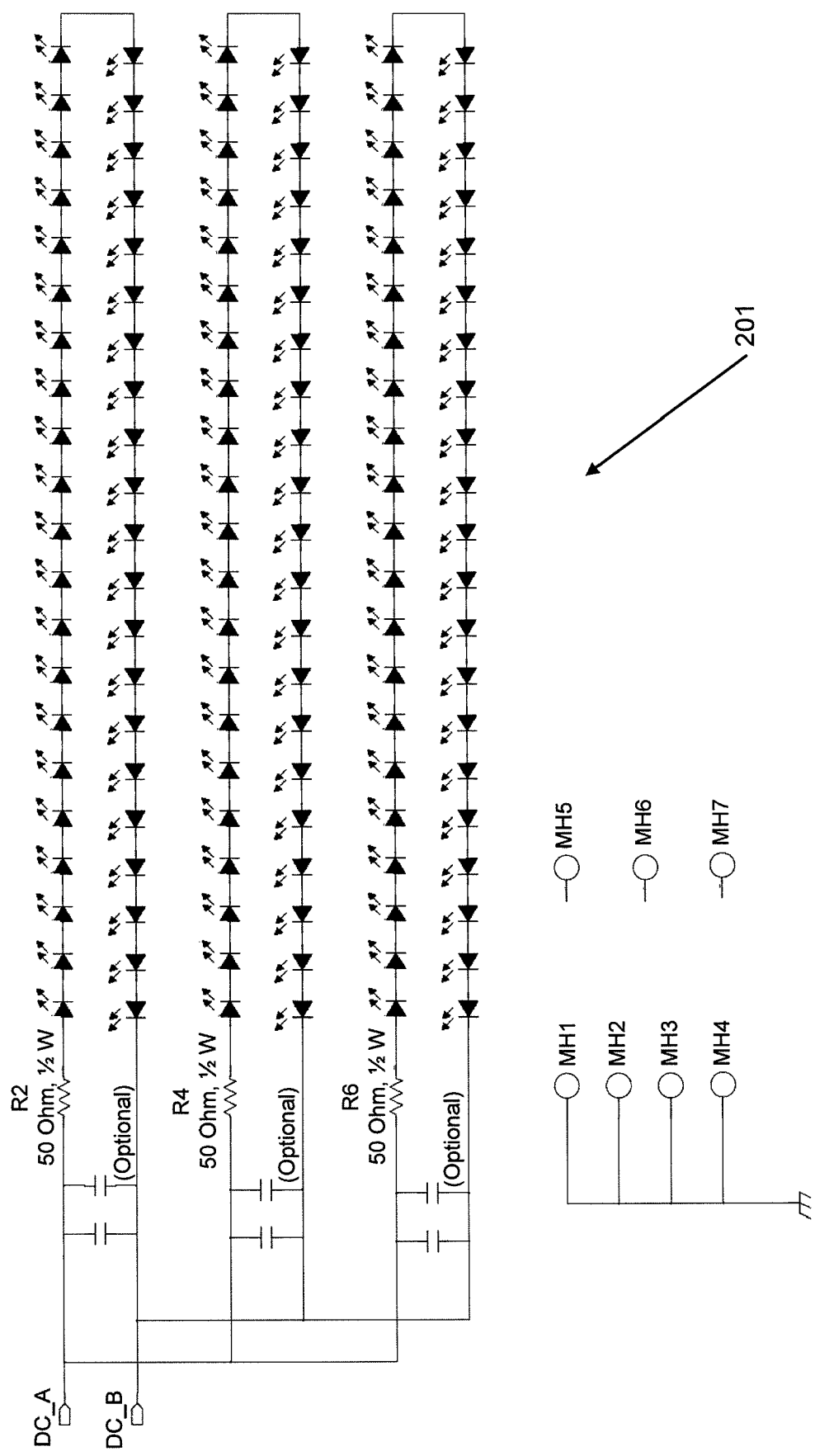
FIG. 11B is a second partial electrical wiring diagram of an embodiment of the LED circuit board

FIGS. 11A and 11B illustrate an electrical wiring diagram 200, 201 of an embodiment of the light fixture 10. These electrical wiring diagrams 200, 201 represent the wiring for the LED circuit board 100 depicted in FIGS. 9A and 9B.

As described above, the light fixture 10 is not IC (Insulated Ceiling) rated. Generally, if the space that a light fixture 10 is to be installed does not contain insulation, a NON-IC rated fixture should be used (NON-IC stands for NON Insulated Contact). If insulation is present in an application where a NON-IC rated fixture is used, a minimum 3" clearance should exist on all sides of the fixture, and no insulation may be present across the top of the installed fixture. By maintaining these clearance requirements, overheating should not be an issue according to testing conducted on the fixture. NON-IC rated fixtures are occasionally used in residential applications, but much more often they can be found in commercial applications. This is because most residential, single-family dwellings will use insulation in the attic space for energy conservation; however, it is less likely that commercial spaces (such as shopping centers and grocery stores) will use insulation as part of their construction.

In another illustrative embodiment, the light fixture 10 is rated for insulated contact (IC-rated). Generally, if a light fixture 10 is intended for direct contact with insulation, it will require an IC rating. An IC rated fixture must, by definition, "be approved for zero clearance insulation cover by and OSHA NRTL laboratory", such as Underwriters Laboratory (commonly referred to as UL). IC ratings on light fixtures are very common in residential applications. Many homes have blown cellulose insulation in the attic space, covering all light fixtures.

Figure 12A:
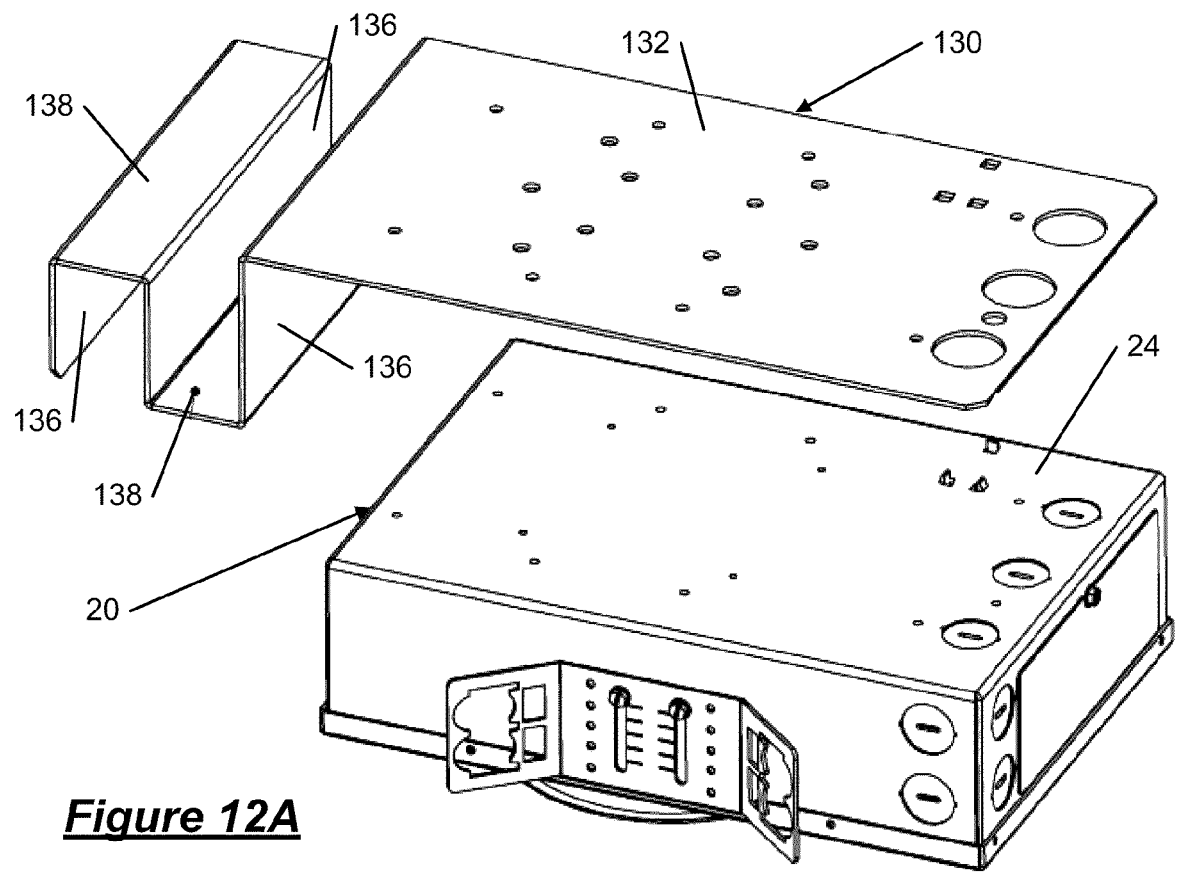
FIG. 12A is an illustration of an embodiment of the light fixture and a heat sink.
Figure 12B:
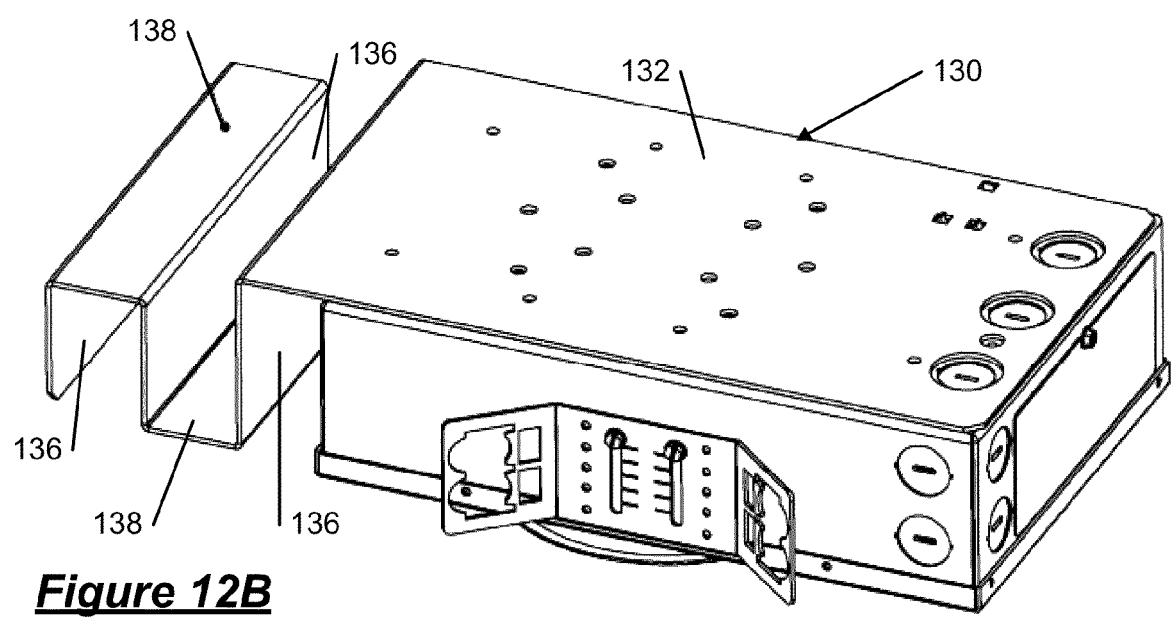
FIG. 12B is an illustration of the heat sink installed on the light fixture depicted in FIG. 12A.

As is shown in FIG. 12A, a heat sink 130 may be utilized to cover the housing assembly 20. By attaching the heat sink 130 as shown in FIG. 12B to the housing assembly 20, the light fixture 10 may then be IC-rated. The heat sink 130 may be made of any desirable material, such as but not limited to aluminum, copper, or steel.

The heat sink 130 may consist of a flat member 132 and a fin member 134. The flat member 132 covers the top panel 24 of the housing assembly 20. Additionally, the heat sink 130 may consist of the fin member 134 which protrudes from the housing assembly 20 horizontally. The fin member 134 may be in the configuration of a square wave. As shown in FIG. 12A, the square wave fin member 134 extends vertically, along a vertical fin 136, approximately the width of the housing assembly front panel 26. The fin member 134 extends horizontally from the vertical fin 136, along a horizontal fin 138. As shown in FIG. 12A, the vertical fin 136 and the horizontal fin 138 repeat three more times, thus creating the square wave configuration. Additional vertical-horizontal fins 136, 138 or square waves may be added to the fin member 134 if required to safely dissipate the heat discharged by the light fixture 10. This square wave heat sink design is used to spread the heat horizontally, instead of vertically, across the entire housing assembly 20 and light fixture 10. Designs other than a square wave may be utilized for the fin member 134 to safely dissipate the heat discharged by the light fixture 10.

The benefit to using this type of design for the heat sink is that the heat sink 130 only minimally adds to the overall vertical clearance required for this light fixture 10. For example, by adding the heat sink 130 may only add ¼" or ⅛" to the overall height of the LED light fixture 10. Other light fixtures may use a vertical-type heat sink; however, these may create vertical clearance problems during the installation design. The light fixture as described above the heat sink can be used in areas which provide low air flow and reduced plenum height.

Figure 13A:
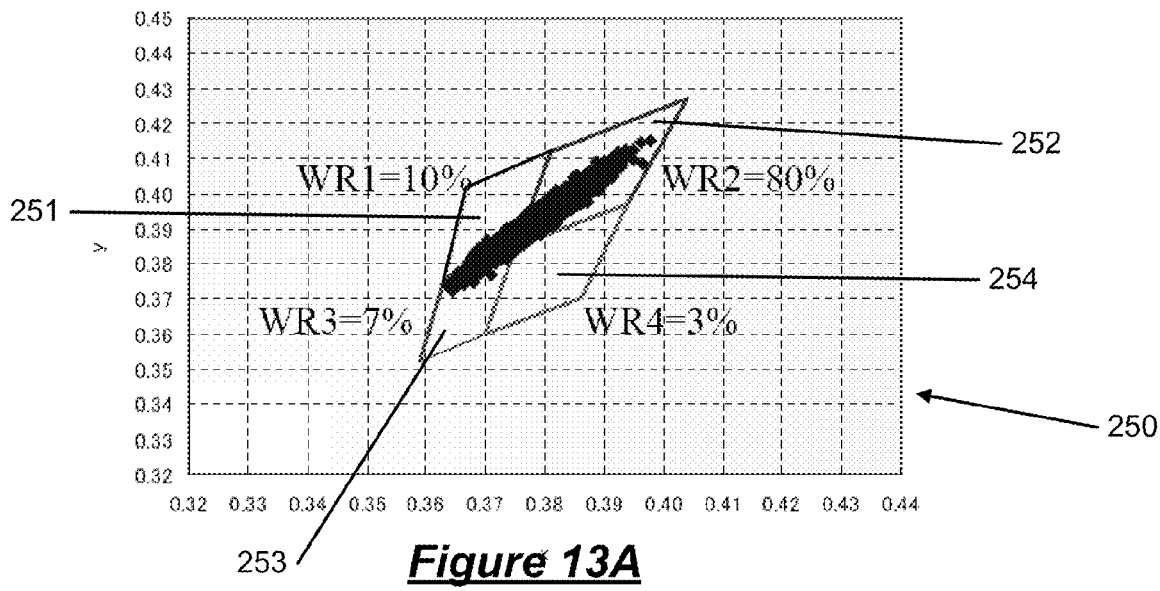
FIG. 13A is a chromaticity chart of an illustrative 4100° K LEDs, utilizing 4 bins.
Figure 13B:
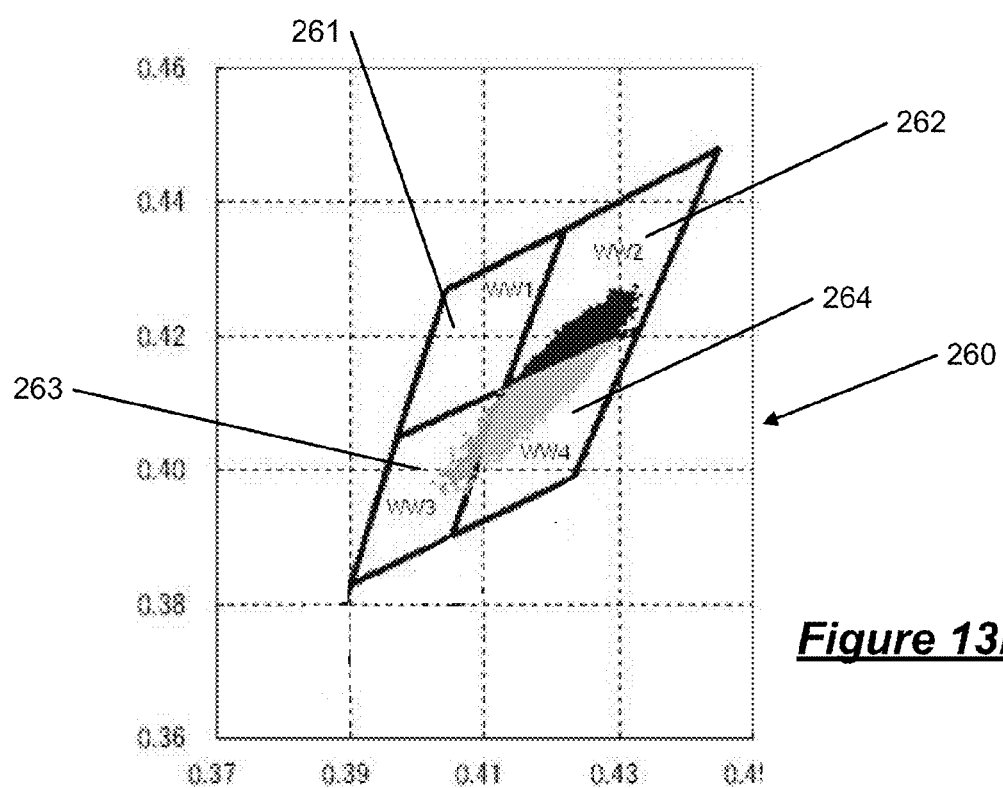
FIG. 13B is a chromaticity chart of an illustrative 3500° K LEDs, utilizing 4 bins.

An additional embodiment of the invention relates to a method in which the LEDs 120 are selected for use within the LED circuit board 100. In the manufacturing of products there is always variation. As with any manufacturing process, the process of manufacturing LEDs inherently creates a variation around a mean. The variation in performance and operational parameters of LEDs 120 can be the source of concern in the many industries, application areas and product development efforts adopting LED technology as a replacement for older light source technologies. Most LED manufacturers offer presorted groups of LEDs (called bins). Typical LED variables requiring binning: radiant (or luminous) flux, correlated color temperature (CCT) or chromaticity coordinates, forward voltage (Vf). Typically, an LED manufacturer will use four or six bins for LEDs. For instance, for a 3000° K LED, Bin 1 may have all LEDs over 3100° K, while Bin 2 may have LEDs between 3000° K and 3100° K, Bin 3 may have LEDs between 2900° K and 3000° K, and finally, Bin 4 may have LEDs less than 2900° K. When an LED user orders a 3000° K LED, they may get one bin or all 4 bins of LEDs, all with varying quantities of LEDs within those bins. The LED user will then need to manage those bins as there can be a visible difference in the brightness, color, and light temperature between the varying LED bins. FIGS. 13A and 13B show illustrative chromaticity charts of a 4100° K and 3500° K LEDs respectively.

In the past, the LED user has utilized different methods to eliminate the binning effect. First, the LED user may specify that they only want a specific bin, when ordering the LEDs. While this eliminates the binning effect of variable brightness levels, this can be expensive to the LED user. The LED manufacturer will normally charge an up-charge or penalty for specifying LEDs from only one bin. Additionally, this can lead to waste of LEDs, as the LEDs from a bin from one order, can not be mixed with LED bins from a different order because of the variability.

Second, the LED user may just mix all LEDs and bins together after receiving the LEDs from the manufacturer. While this eliminates the up-charge and is less expensive, this method does not create a consistent color and temperature light to the end user of the LED lights. By mixing bins and LEDs together, the brightness variation is somewhat diminished, however, there may still be noticeable visible differences in the LED light output from LED light to LED light. Additionally, because most LED fixtures that are used for residential or commercial light settings are made up of one or a few LED lights, the variation of light quality between fixture to fixture can be noticeably visible.

An embodiment of the present invention provides a cost-effective solution to the binning effect inherent in LED manufacturing. First, in the embodiment, as mentioned above, the LED down light 10 utilizes a large number of miniature LEDs 120, for example 252 LEDs. Therefore, by using 252 LED lights, the variation between all of the LED lights is averaged together to provide a number that is much closer to the desired output. Additionally, the variation between fixture to fixture is much less because of this averaging effect.

Additionally, in another embodiment, a method for selecting LEDs is used to eliminate the binning effect. First, the LED user may determine if there is a statistical significance of the number of LEDs received in each bin by continuously determining a percentage of LEDs corresponding to each of the bins. To determine this statistical significance, the LED user must retrieve historical data for the number of LEDs for each bin. From the historical data, the LED user may determine the LED bins with the two highest yields. Those bins may then be used to assemble the LED circuit board. The process calls to continually collect data and update the statistical distribution as LEDs are purchased and make necessary changes to the LED bin mixing.

FIG. 13A shows an illustrative chromaticity chart 250 for a 4100° K LED. As is shown in FIG. 13A, there are 4 different bins, Bin 1 251, Bin 2 252, Bin 3 253, Bin 4 254. As can be seen by the chromaticity chart in FIG. 13A, Bin 2 252 and Bin 1 251 are the two highest yielding bins.

FIG. 13B shows an illustrative chromacity chart 260 for a 3500° K LED. As is shown in FIG. 13B, there are 4 different bins, Bin 1 261, Bin 2 262, Bin 3 263, and Bin 4 264. As can be seen by the chromaticity chart in FIG. 13B, Bin 2 262 and Bin 4 264 are the two highest yielding bins.

Figure 14:
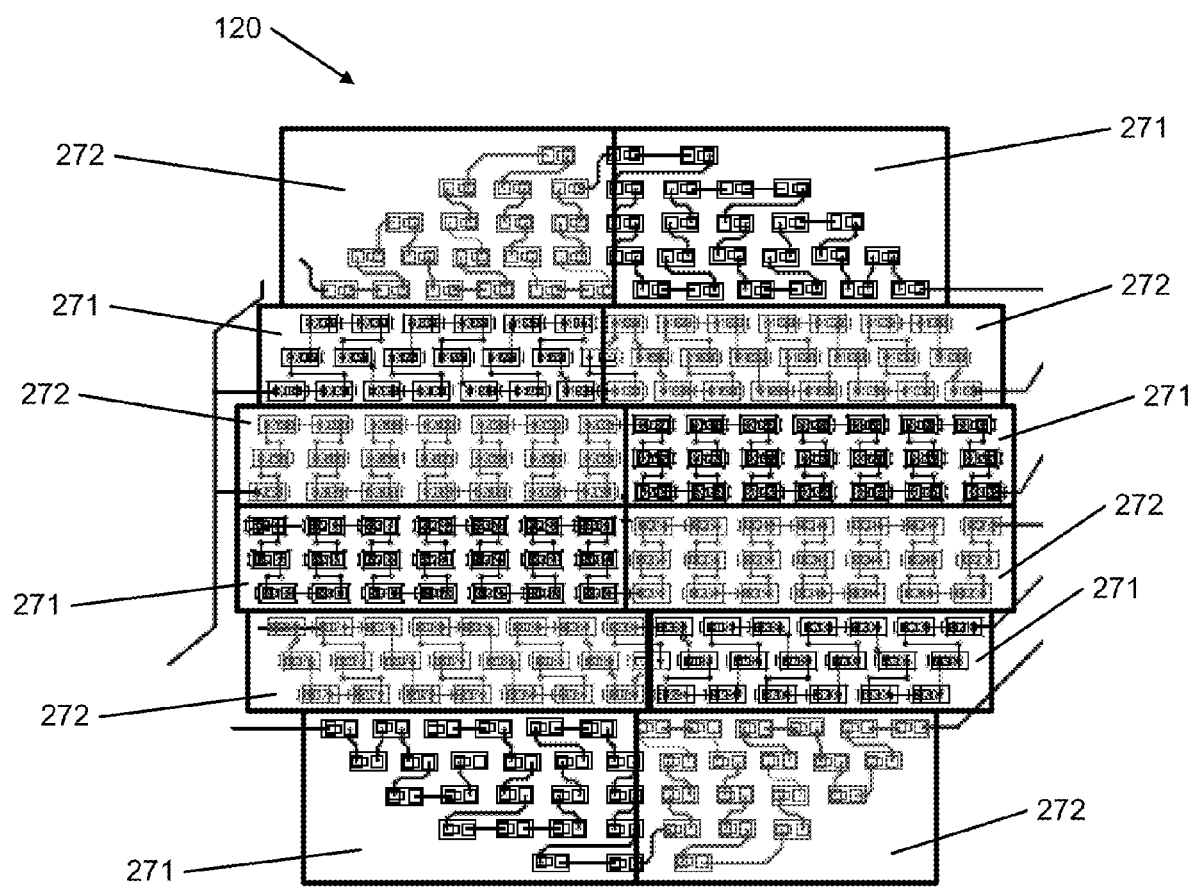
FIG. 14 is a top plan view of the LEDs showing the use of two different bins for the configuration of the LEDs.

As is shown in FIG. 14, the LED user will then use the first of the two highest yield bins on the first part of first LED cluster 271 and the second of the two highest yield bins on the second part of the first LED cluster 272. For the second LED cluster, the LED user may use the second of the two highest yield bins on the first part of the second LED cluster 272 and the first of the two highest yield bins on the second part of the second LED cluster 271. For the third LED cluster, the LED user will follow the same configuration as the first LED cluster, while for the fourth LED cluster, the LED user will follow the same configuration as the second LED cluster, and so on for all LED clusters. This configuration of using specific LED bins in specific LED cluster locations will greatly improve the LED light output for both color and brightness. Depending on the desired average color temperature, LEDs of a nominal color temperature may be mixed with one of a distinctly higher color temperature for the purpose of increasing or reducing the average color temperature, or to make use of excess bins that otherwise would be scrapped. For example, it may be desired to produce a 3000° K LED fixture. However, the closest available color temperature is 2800° K. Rather than custom order a 3000° K LED and incur an increased cost, it is easier to mix standard 2800° K LEDs with 3500° K or 4100° K to raise the average color temperature.

While described in terms of mounting the fixture on the ceiling, it should be understood that the recessed light 10 could also be mounted on a different surface such as a wall if so desired.

The present invention has been described in terms of preferred and exemplary embodiments thereof. Numerous other embodiments, modifications and variations within the scope and spirit of the appended claims will occur to persons of ordinary skill in the art from a review of this disclosure.

We claim:

1. A light-emitting diode (LED) circuit board connected to an AC power source used for a recessed down light fixture, comprising:

a plurality of resistors electrically connected to the LED circuit board;

a bridge rectifier electrically connected to the LED circuit board for converting the AC power to DC power; and a plurality of at least 80 miniature LEDs electrically connected to the LED circuit board and configured to provide an appearance of a single light source, wherein the plurality of miniature LEDs are separated into a plurality of LED clusters, each LED cluster electrically connected to at least one resistor, and further wherein the plurality of miniature LEDs are arranged in a configuration such that a voltage differential across any two proximate LEDs is less than 36 volts.

2. The LED circuit board of claim 1, wherein the voltage differential between any two proximate LEDs is less than 24 volts.

3. The LED circuit board of claim 1, wherein the plurality of miniature LEDs are arranged in a circular pattern configured to provide a uniform light appearance.

4. The LED circuit board of claim 1, wherein each LED cluster includes at least 20 miniature LEDs.

5. The LED circuit board of claim 1, wherein the LED circuit board includes at least 4 LED clusters.

6. The LED circuit board of claim 1, wherein each LED cluster includes at least 42 miniature LEDs.

7. The LED circuit board of claim 1, wherein the LED circuit board includes at least 6 LED clusters.

8. The LED circuit board of claim 1, further comprising a plurality of capacitors electrically connected to the circuit board.

9. The LED circuit board of claim 1, further comprising a pair of fuses electrically connected to the LED circuit board.

10. The LED circuit board of claim 9, wherein a first fuse is utilized as a safety fuse to protect the circuit board from voltage surges.

11. The LED circuit board of claim 10, wherein a second fuse is utilized as a switching fuse to operate the light fixture between two light output modes, a high light output mode and a low output mode.

12. The LED circuit board of claim 11, wherein the second fuse is preinstalled to operate the light fixture in the high light output mode.

13. The LED circuit board of claim 11, wherein the second fuse is not preinstalled to operate the light fixture in the low light output mode.

14. The LED circuit board of claim 1, wherein the circuit board further comprises a surge suppressor to protect against voltage surges.

15. A light-emitting diode (LED) circuit board connected to a power source used for a recessed down light fixture, comprising:
a plurality of resistors electrically connected to the LED circuit board;
a bridge rectifier electrically connected to the LED circuit board;
a pair of fuses electrically connected to the LED circuit board, wherein the pair of fuses includes a first fuse and a second fuse; and
a plurality of miniature LEDs electrically connected to the LED circuit board, wherein the plurality of miniature LEDs provide a light source in one of two factory-selectable modes, the first mode being operable with the second fuse preinstalled and the second mode being operable with the second fuse not preinstalled, further, wherein the first mode is a high light output and the second mode is a low light output.

16. A light-emitting diode (LED) recessed down light fixture, comprising:
a housing having four side panels and a top panel;
a bottom frame attached to the housing, wherein the bottom frame has an aperture;
a reflector assembly mounted to the housing through the aperture;
an LED circuit board attached to the inside of the top panel of the housing over the reflector assembly comprising,
a plurality of resistors electrically connected to the LED circuit board,
a bridge rectifier electrically connected to the LED circuit board for converting the AC power to DC power, and
a plurality of at least 80 miniature LEDs electrically connected to the LED circuit board and configured to provide light, wherein the plurality of miniature LEDs are separated into a plurality of LED clusters, each cluster electrically connected to at least one resistor, and further wherein the plurality of miniature LEDs are arranged in a configuration such that a voltage differential across any two proximate LEDs is less than 36 volts; and
a lens cover attached to the top end of the reflector assembly configured to cover the LED circuit board.

17. The LED recessed down light fixture of claim 16, wherein the voltage differential is less than 24 volts.

18. The LED recessed down light fixture of claim 16, wherein the plurality of miniature LEDs are arranged in a circular pattern configured to provide an appearance of a single light source.

19. The LED recessed down light fixture of claim 16, wherein each LED cluster includes at least 20 miniature LEDs.

20. The LED recessed down light fixture of claim 16, wherein the LED circuit board includes at least 4 LED clusters.

21. The LED recessed down light fixture of claim 16, wherein each LED cluster includes at least 42 miniature LEDs.

22. The LED recessed down light fixture of claim 16, wherein the LED circuit board includes at least 6 LED clusters.

23. The LED recessed down light fixture of claim 16, wherein the LED circuit board further comprising a plurality of capacitors electrically connected to the circuit board.

24. The LED recessed down light fixture of claim 16, further comprising a pair of fuses electrically connected to the LED circuit board.

25. The LED recessed down light fixture of claim 24, wherein a first fuse is utilized as a safety fuse to protect the circuit board from voltage surges.

26. The LED recessed down light fixture of claim 24, wherein a second fuse is utilized as a switching fuse to operate the light fixture between two light output modes, a high light output mode and a low output mode.

27. The LED recessed down light fixture of claim 26, wherein the second fuse is preinstalled to operate the light fixture in the high light output mode.

28. The LED recessed down light fixture of claim 26, wherein the second fuse is not preinstalled to operate the light fixture in the low light output mode.

29. The LED recessed down light fixture of claim 16, wherein the circuit board further comprises a surge suppressor to protect against voltage surges.

30. The LED recessed down light fixture of claim 16, wherein the lens cover includes a lens reflector that focuses the light from the LEDs into the reflector assembly.

31. The LED recessed down light fixture of claim 16, wherein the housing is aluminum.

32. The LED recessed down light fixture of claim 16, wherein the reflector assembly has a top end and a bottom end and the top end is installed within the aperture, and the bottom end protrudes from the housing.

33. The LED recessed down light fixture of claim 16, wherein the light fixture further comprises a junction box mounted to one of the side panels of the housing and a divider attached to the frame located between the aperture and the junction box.

34. The LED recessed down light fixture of claim 16, wherein the light fixture further comprises an external capacitor electrically connected to the LED circuit board and mounted inside a junction box.

35. The LED recessed down light fixture of claim 16, wherein the light fixture further comprises a plurality of mounting brackets attached to the side panels of the housing.

36. The LED recessed down light fixture of claim 16, wherein the light fixture further comprises a thermal protector located within the housing and configured to stop the power when the thermal protector detects excessive heat within the housing.

37. The LED recessed down light fixture of claim 16, wherein the light fixture further comprises a heat sink.

38. The LED recessed down light fixture of claim 37, wherein the heat sink is mounted on top of the top panel of the housing.

39. The LED recessed down light fixture of claim 37, wherein the height of the light fixture with the heat sink mounted is no more than ¼ inch taller than the height of the light fixture without the heat sink mounted.

40. The LED recessed down light fixture of claim 37, wherein the heat sink comprises of a flat member mounted to the top panel of the housing and a fin member that extends horizontally from the flat member and the front panel of the housing.

41. The LED recessed down light fixture of claim 40, wherein the fin member of the heat sink comprises a set of vertical fins and horizontal fins configured in a square wave pattern.

42. A method for manufacturing light fixtures comprising a plurality of LEDs where each of the plurality of LEDs is supplied in manner that corresponds to one of a plurality of presorted bins, the method comprising the steps of:
   (a) continuously determining a percentage of LEDs corresponding to each of the plurality of bins;
   (b) continuously determining a first bin that corresponds to the percentage of LEDs with a highest incidence;
   (c) continuously determining a second bin that corresponds to percentage of LEDs with a second highest incidence;
   (d) electrically connecting the plurality of LEDs to an LED circuit board, wherein the LEDs are separated into a plurality of LED clusters, wherein the LED circuit board comprises:
      a first LED cluster with two parts, a first part with LEDs from the first bin and a second part with LEDs from the second bin, the number of LEDs from the first bin and the second bin approximately equal; and
      a second LED cluster with two parts, a first part with LEDs from the first bin and a second part with LEDs from the second bin, the number of LEDs from the first bin and second bin approximately equal,
      wherein the first part of the first LED cluster is proximate to the second part of the second LED cluster and the second part of the first LED cluster is proximate to the first part of the second LED cluster.

43. The method of claim 42, wherein the plurality of LEDs are arranged in a circular pattern configured to provide an appearance of a single light source.

44. The method of claim 42, wherein each cluster contains 42 LEDs.

45. The method of claim 42, wherein the LED circuit board contains at least 6 LED clusters.

46. The method of claim 42, wherein the LED circuit board further comprises a third LED cluster with two parts, a first part with LEDs from the first bin and a second part with LEDs from the second bin, the number of LEDs from the first bin and second bin approximately equal, wherein the first part of the second LED cluster is proximate to the second part of the third LED cluster and the second part of the second LED cluster is proximate to the first part of the third LED cluster.

47. The method of claim 46, wherein the LED circuit board further comprises a fourth LED cluster with two parts, a first part with LEDs from the first bin and a second part with LEDs from the second bin, the number of LEDs from the first bin and second bin approximately equal, wherein the first part of the third LED cluster is proximate to the second part of the fourth LED cluster and the second part of the third LED cluster is proximate to the first part of the fourth LED cluster.

48. The method of claim 47, wherein the LED circuit board further comprises a fifth LED cluster with two parts, a first part with LEDs from the first bin and a second part with LEDs from the second bin, the number of LEDs from the first bin and second bin approximately equal, wherein the first part of the fourth LED cluster is proximate to the second part of the fifth LED cluster and the second part of the fourth LED cluster is proximate to the first part of the fifth LED cluster.

49. The method of claim 48, wherein the LED circuit board further comprises a sixth LED cluster with two parts, a first part with LEDs from the first bin and a second part with LEDs from the second bin, the number of LEDs from the first bin and second bin approximately equal, wherein the first part of the fifth LED cluster is proximate to the second part of the sixth LED cluster and the second part of the fifth LED cluster is proximate to the first part of the sixth LED cluster.

* * * * *